(12) United States Patent
Mukai et al.

(10) Patent No.: US 10,957,598 B2
(45) Date of Patent: Mar. 23, 2021

(54) TERAHERTZ DEVICE

(71) Applicant: ROHM CO., LTD., Kyoto (JP)

(72) Inventors: Toshikazu Mukai, Kyoto (JP); Jae Young Kim, Kyoto (JP); Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/755,839

(22) PCT Filed: Oct. 2, 2018

(86) PCT No.: PCT/JP2018/036842
§ 371 (c)(1),
(2) Date: Apr. 13, 2020

(87) PCT Pub. No.: WO2019/077994
PCT Pub. Date: Apr. 25, 2019

(65) Prior Publication Data
US 2020/0279776 A1 Sep. 3, 2020

(30) Foreign Application Priority Data

Oct. 18, 2017 (JP) .............................. JP2017-201992
Aug. 23, 2018 (JP) .............................. JP2018-155898

(51) Int. Cl.
*H01L 21/822* (2006.01)
*H01L 29/88* (2006.01)
*H01L 29/866* (2006.01)

(52) U.S. Cl.
CPC .......... *H01L 21/822* (2013.01); *H01L 29/866* (2013.01); *H01L 29/88* (2013.01)

(58) Field of Classification Search
None
See application file for complete search history.

(56) References Cited

U.S. PATENT DOCUMENTS

2016/0211570 A1* 7/2016 Jin .......................... H01Q 21/28
2016/0373061 A1* 12/2016 Sekiguchi ................ H03B 7/08

FOREIGN PATENT DOCUMENTS

| JP | 2009-80448 A1 | 4/2009 |
| JP | 2010-206683 A | 9/2010 |
| JP | 2015-180049 A | 10/2015 |
| JP | 2017-069678 A | 4/2017 |
| WO | 2005/055366 A1 | 6/2005 |

OTHER PUBLICATIONS

International Search Report issued in PCT/JP2018/036842, dated Dec. 18, 2018 (1 page).

* cited by examiner

*Primary Examiner* — Alexander G Ghyka
(74) *Attorney, Agent, or Firm* — Hamre, Schumann, Mueller & Larson, P.C.

(57) ABSTRACT

According to one aspect of the present disclosure, a terahertz device is provided. The terahertz device includes a semiconductor substrate, a terahertz element, and a first rectifying element. The terahertz element is disposed on the semiconductor substrate. The first rectifying element is electrically connected to the terahertz element in parallel.

20 Claims, 33 Drawing Sheets

FIG.5
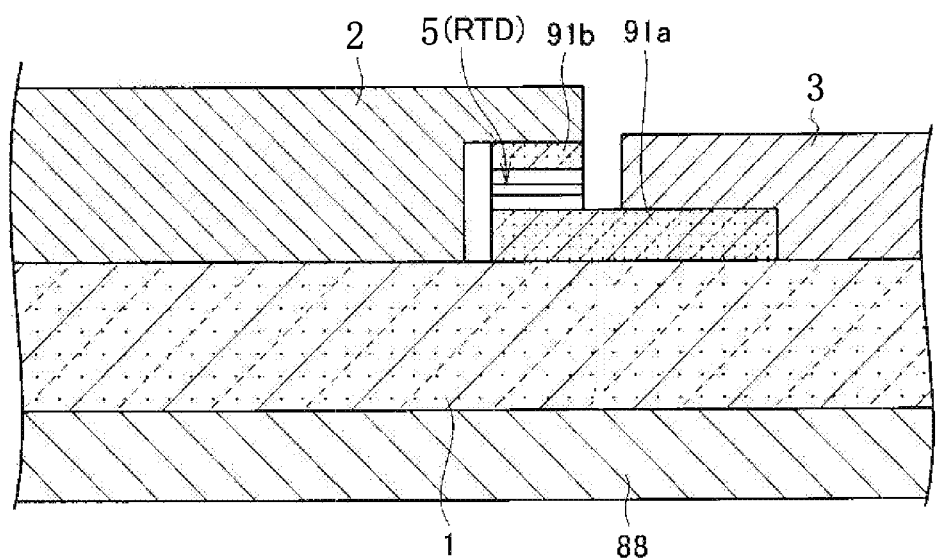
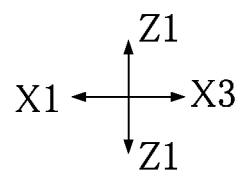

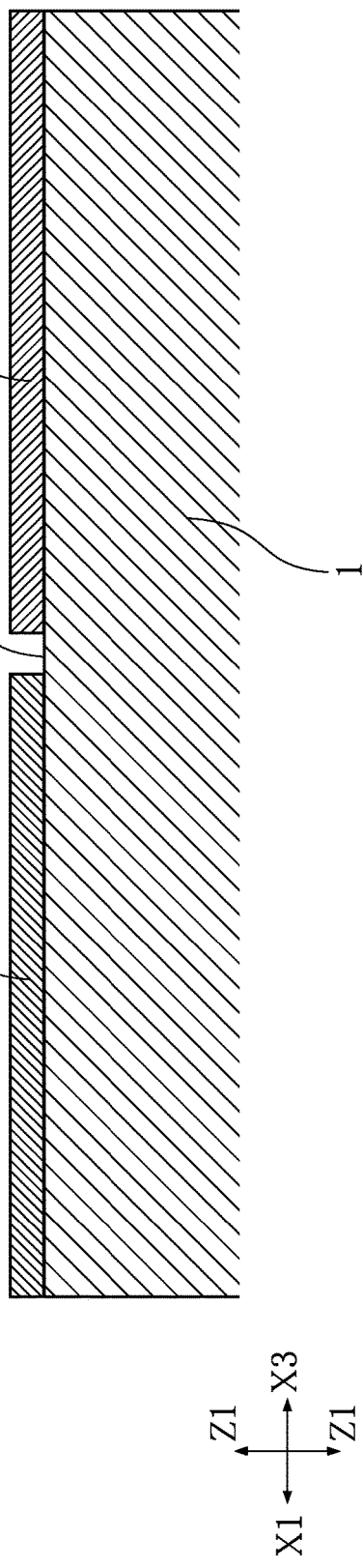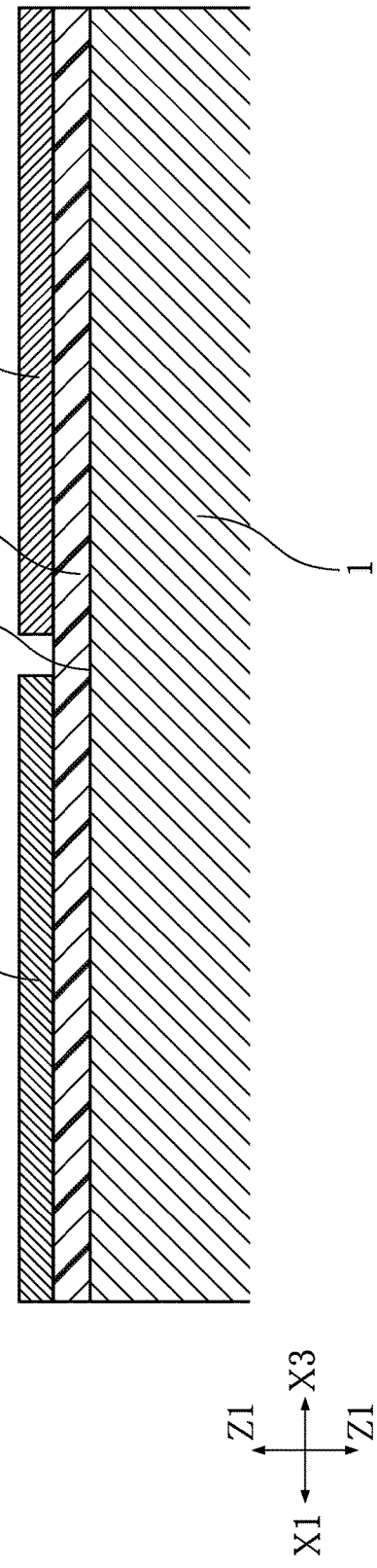

FIG.9
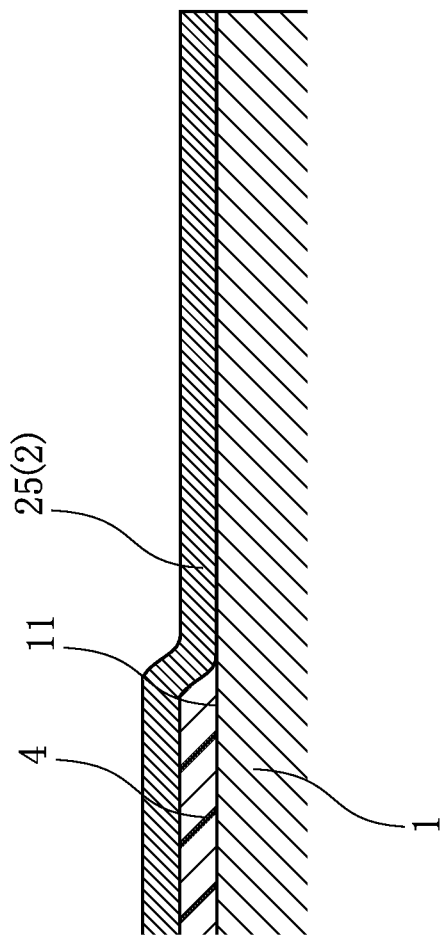
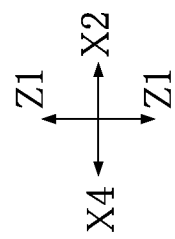

TERAHERTZ DEVICE

TECHNICAL FIELD

The present disclosure relates to a terahertz device.

BACKGROUND ART

In recent years, as electronic devices such as transistors are miniaturized and their sizes are reduced to nano-scale, a new phenomenon called quantum effect has been observed. Studies are being made to develop an ultra-high speed device or a new function device utilizing the quantum effect. In particular, attempts are being made to utilize the frequency range of 0.1 to 10 THz, called a terahertz band, to perform high-capacity communication or information processing, imaging and measurement, for example. This frequency region is an undeveloped region between light and radio waves, and a device that operates in this frequency band, if realized, could be used for many applications such as imaging and high-capacity communication or information processing described above, as well as measurement in various fields such as physical properties, astronomy or biology.

SUMMARY OF THE INVENTION

A main object of the present disclosure is to provide a more preferable terahertz device.

According to a first aspect of the present disclosure, a terahertz device is provided. The terahertz device includes a semiconductor substrate, a terahertz element, and a first rectifying element. The terahertz element is disposed on the semiconductor substrate. The first rectifying element is electrically connected to the terahertz element in parallel.

Other features and advantages of the present disclosure will become more apparent from the detailed description given below with reference to the accompanying drawings.

BRIEF DESCRIPTION OF THE DRAWINGS

FIG. 5 is a sectional view showing details of a terahertz element of the first embodiment;

FIG. 7 is a sectional view along line VII-VII in FIG. 2;

FIG. 8 is a sectional view along line VIII-VIII in FIG. 2;

FIG. 9 is a sectional view along line IX-IX in FIG. 2;

MODE FOR CARRYING OUT THE INVENTION

Embodiment of the present disclosure are described below with reference to the accompanying drawings.

The description that "an object A is formed on an object B" and "an object A is formed above an object B" includes, unless otherwise suggested, "the object A is formed directly on the object B" and "the object A is formed on the object B with another object interposed between the object A and the object B". Similarly, the description that "an object A is disposed on an object B" and "an object A is disposed above an object B" includes, unless otherwise suggested, "the object A is disposed directly on the object B" and "the object A is disposed on the object B with another object interposed between the object A and the object B". Similarly, the description that "an object A is positioned on an object B" and "an object A is positioned above an object B" includes, unless otherwise suggested, "the object A is positioned directly on the object B" and "the object A is positioned on the object B with another object interposed between the object A and the object B". Similarly, the description that "an object A is stacked on an object B" and "an object A is stacked over an object B" includes, unless otherwise suggested, "the object A is stacked directly on the object B" and "the object A is stacked on the object B with another object interposed between the object A and the object B".

First Embodiment

A first embodiment of the present disclosure is described below with reference to FIGS. 1-24.

Figure 1:
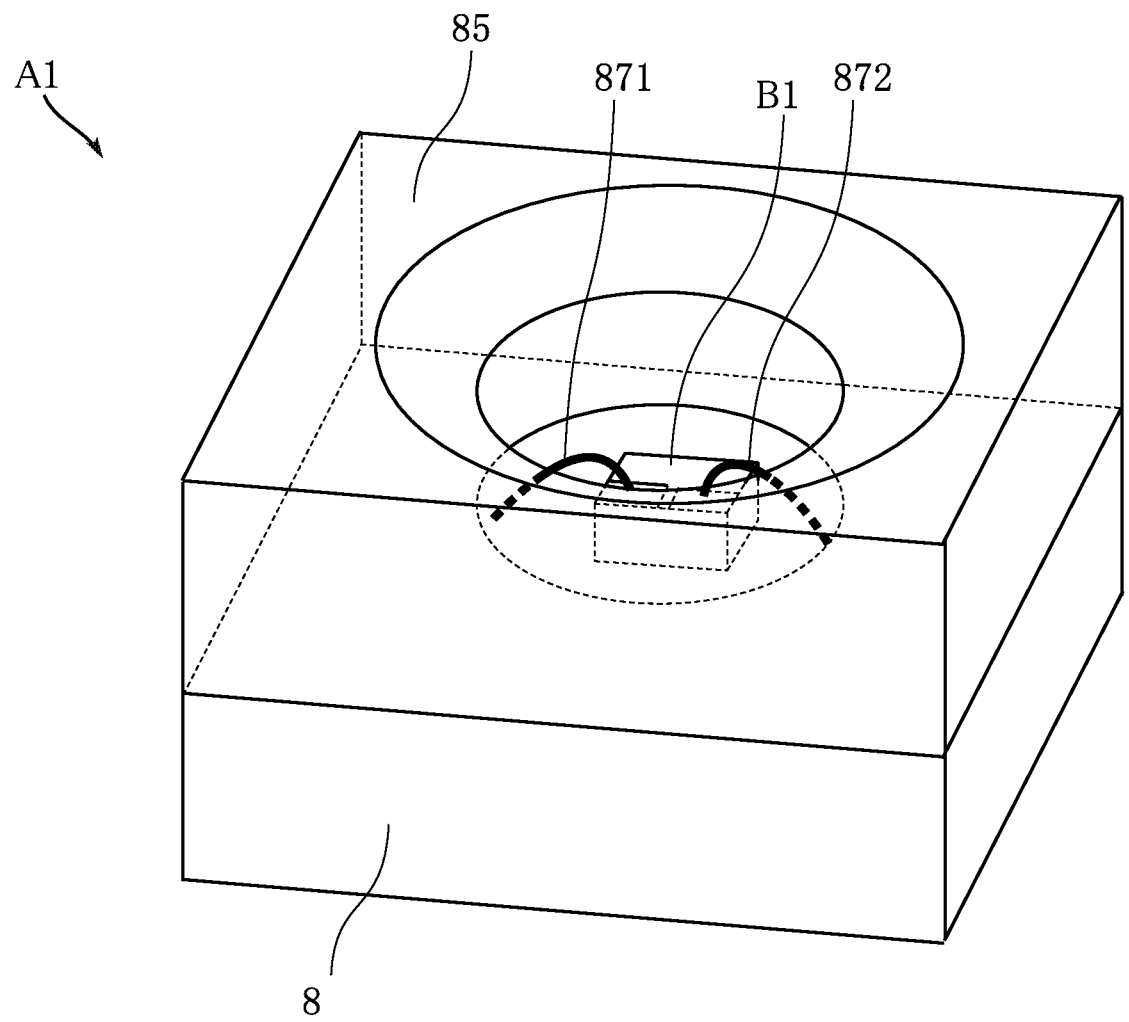
FIG. 1 is a perspective view showing a terahertz device according to a first embodiment.

FIG. 1 is a perspective view showing a terahertz device according to the first embodiment.

A terahertz device A1 in FIG. 1 includes a semiconductor component B1, a support 8, a resin member 85, and wires 871, 872.

Figure 2:
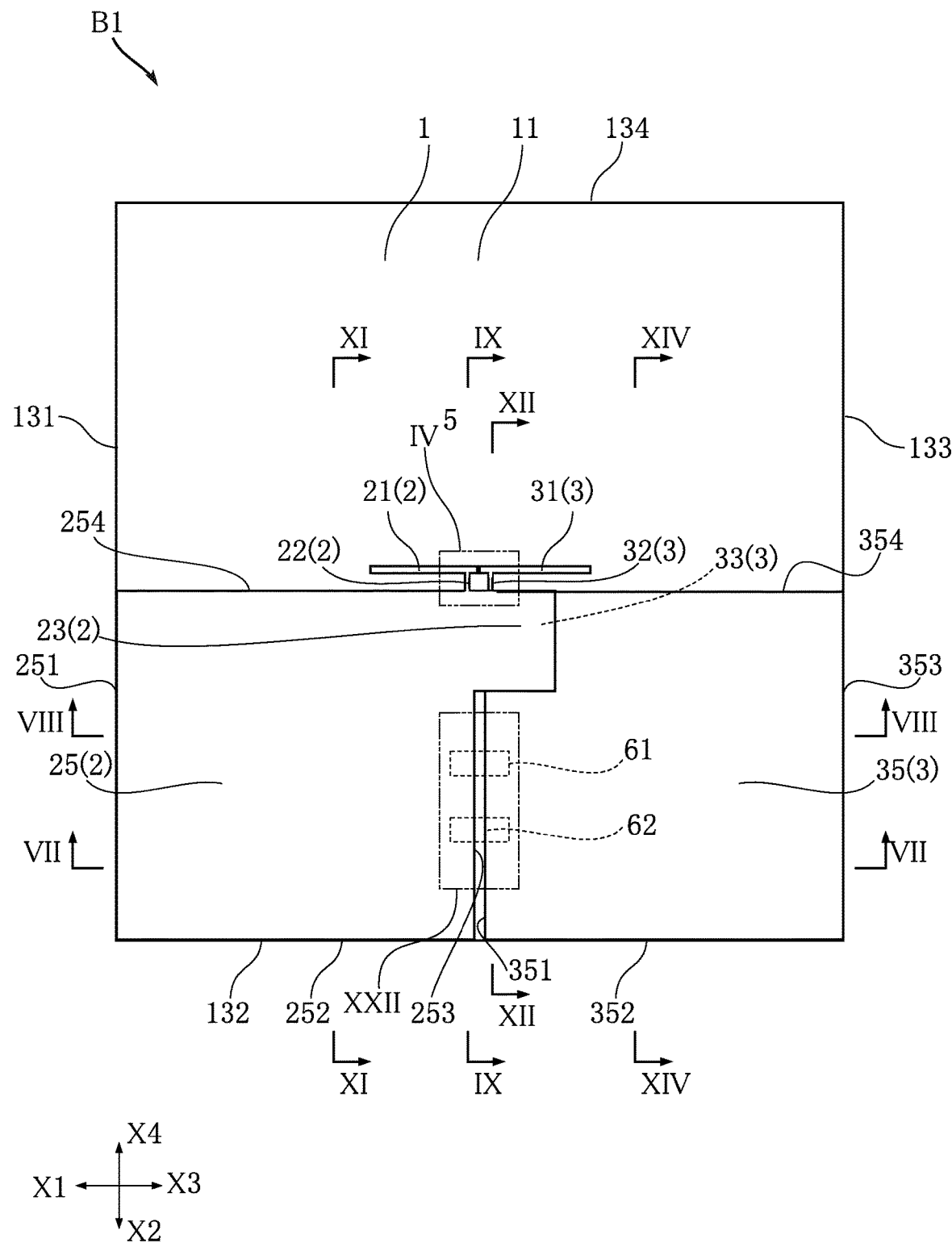
FIG. 2 is a plan view showing a semiconductor component according to the first embodiment.

FIG. 2 is a plan view showing a semiconductor component according to the first embodiment.

The semiconductor component B1 shown in FIG. 2 radiates high-frequency electromagnetic waves with frequencies in the terahertz band. Instead of radiating the electromagnetic waves in the terahertz band, the semiconductor component B1 may receive the electromagnetic waves. Alternatively, the semiconductor component B1 may radiate and receive the electromagnetic waves in the terahertz band. The semiconductor component B1 includes a semiconductor substrate 1, a first conductive layer 2, a second conductive layer 3, an insulating layer 4 (see FIG. 5, etc.), a terahertz element 5, a first rectifying element 61, and a second rectifying element 62.

The semiconductor substrate 1 is made of a semiconductor and has a semi-insulating property. The semiconductor forming the semiconductor substrate 1 is InP, for example, but may be a semiconductor other than InP. The semiconductor substrate 1 has a surface 11. The surface 11 faces in a thickness direction Z1 (see FIG. 5, etc.) of the semiconductor substrate 1.

As shown in FIG. 2, the semiconductor substrate 1 includes edges 131-134. The edge 131 and the edge 133 are spaced apart from each other in a first direction X1. Both of the edge 131 and the edge 133 extend along a second direction X2. The second direction X2 is perpendicular to the first direction X1. The edge 132 and the 134 are spaced apart from each other in the second direction X2. Both of the edge 132 and the edge 134 extend along the first direction X1. The edge 131 is connected to the edge 132, the edge 132 to the edge 133, the edge 133 to the edge 134, and the edge 134 to the edge 131.

Figure 4:
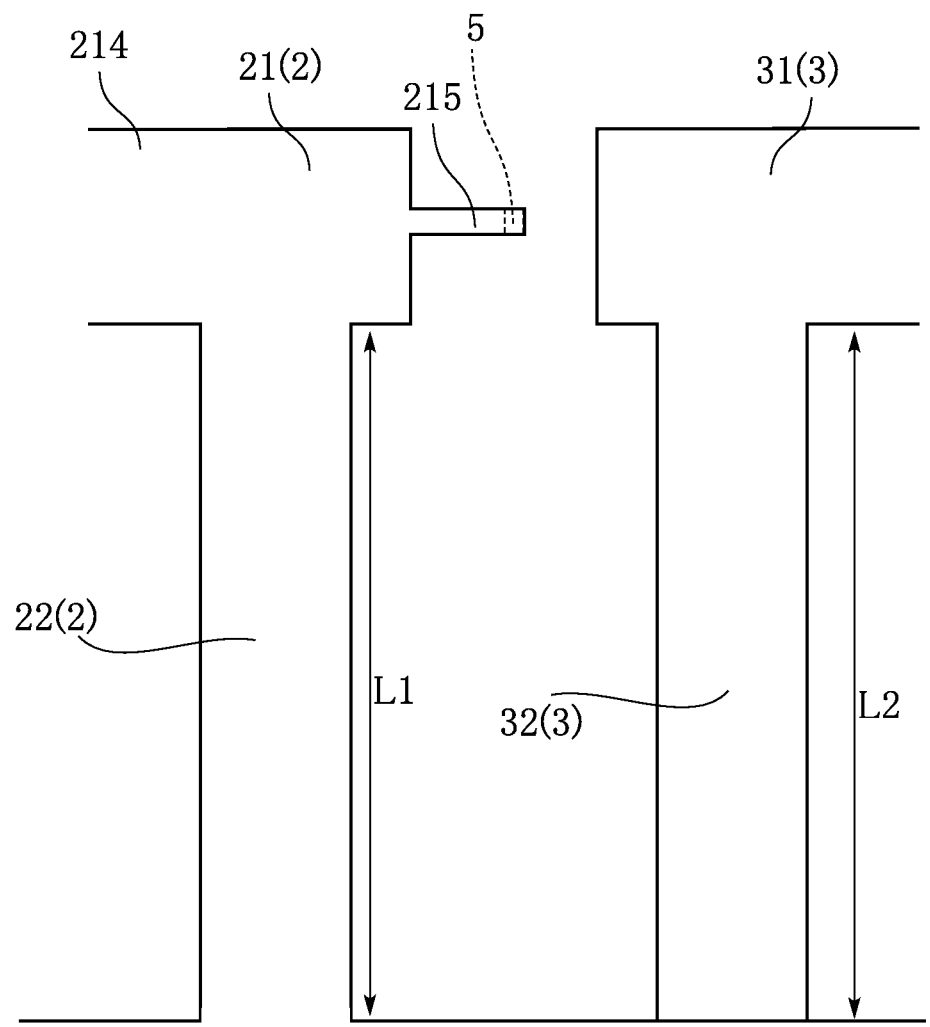
FIG. 4 is a partially enlarged view showing a region IV in FIG. 2.

FIG. 4 is a partially enlarged view showing the region IV in FIG. 2. FIG. 5 is a sectional view showing details of a terahertz element according to the first embodiment.

The terahertz element 5, which is shown in FIGS. 2, 4, and 5, is formed on the semiconductor substrate 1. The terahertz element 5 is electrically connected to the first conductive layer 2 and the second conductive layer 3. The electromagnetic waves emitted from the terahertz element 5 are reflected by a back-surface reflective metal layer 88, to have a surface-emission radiation pattern perpendicular to the semiconductor substrate 1 (in the thickness direction Z1).

The terahertz element 5 is typically an RTD. The terahertz element 5 may be constituted of a diode other than an RTD or a transistor. For example, the terahertz element 5 may be constituted of a tunnel transit time (TUNNETT) diode, an impact ionization avalanche transit time (IMPATT) diode, a GaAs-based field effect transistor (FET), a GaN-based FET, a high electron mobility transistor (HEMT), or a heterojunction bipolar transistor (HBT).

Figure 6:
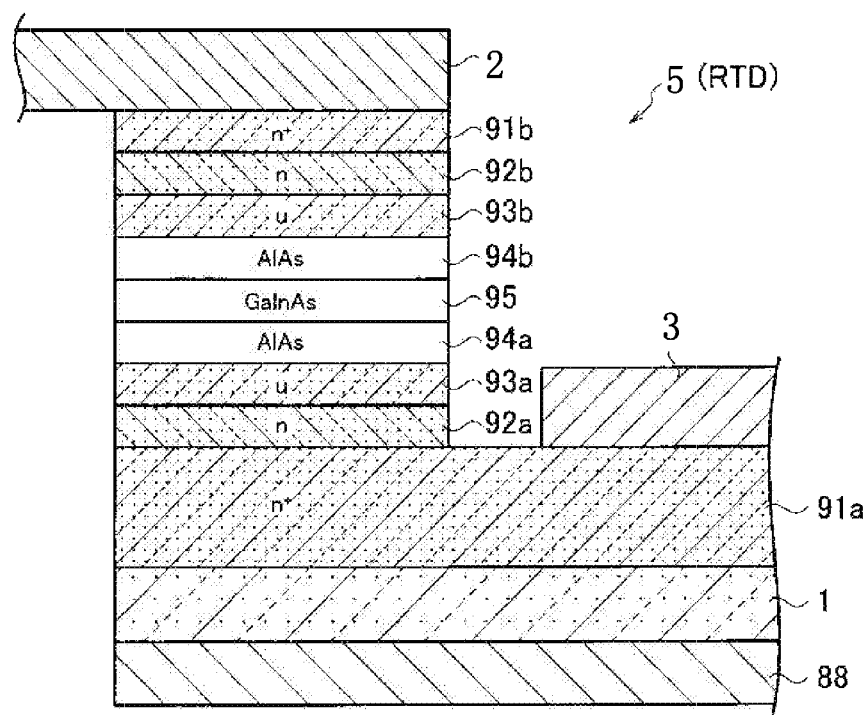
FIG. 6 is a partially enlarged view of FIG. 5.

One implementation of the terahertz element 5 is described below with reference to FIG. 6. FIG. 6 is a partially enlarged view of FIG. 5. A GaInAs layer 92a is disposed on a semiconductor layer 91a (which is made of GaInAs, for example) and doped with an n-type impurity. A GaInAs layer 93a is disposed on the GaInAs layer 92a and not doped with any impurity. An AlAs layer 94a is disposed on the GaInAs layer 93a, an InGaAs layer 95 on the AlAs layer 94a, and an AlAs layer 94b on the InGaAs layer 95. The AlAs layer 94a, the InGaAs layer 95 and the AlAs layer 94b constitute an RTD part. A GaInAs layer 93b is disposed on the AlAs layer 94b and not doped with any impurity. A GaInAs layer 92b is disposed on the GaInAs layer 93b and doped with an n-type impurity. A GaInAs layer 91b is disposed on the GaInAs layer 92b and doped with an n-type impurity at high concentration. The first conductive layer 2 is positioned on the GaInAs layer 91b.

Though not illustrated, unlike the configuration shown in FIG. 6, a GaInAs layer doped with an n-type impurity at high concentration may be interposed between the GaInAs layer 91b and the first conductive layer 2. Such a configuration can enhance the contact between the first conductive layer 2 and the GaInAs layer 91b.

Figure 20:
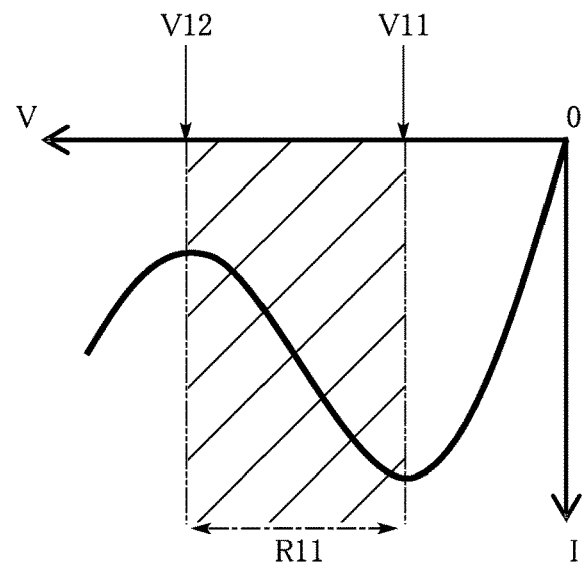
FIG. 20 is a graph showing an example of a current-voltage characteristic of the terahertz element according to the first embodiment.

Referring to FIG. 20, a graph showing a current-voltage characteristic of the terahertz element 5 includes a region R11 in which the inclination takes negative values. The region R11 is where terahertz waves are radiated.

Figure 10:
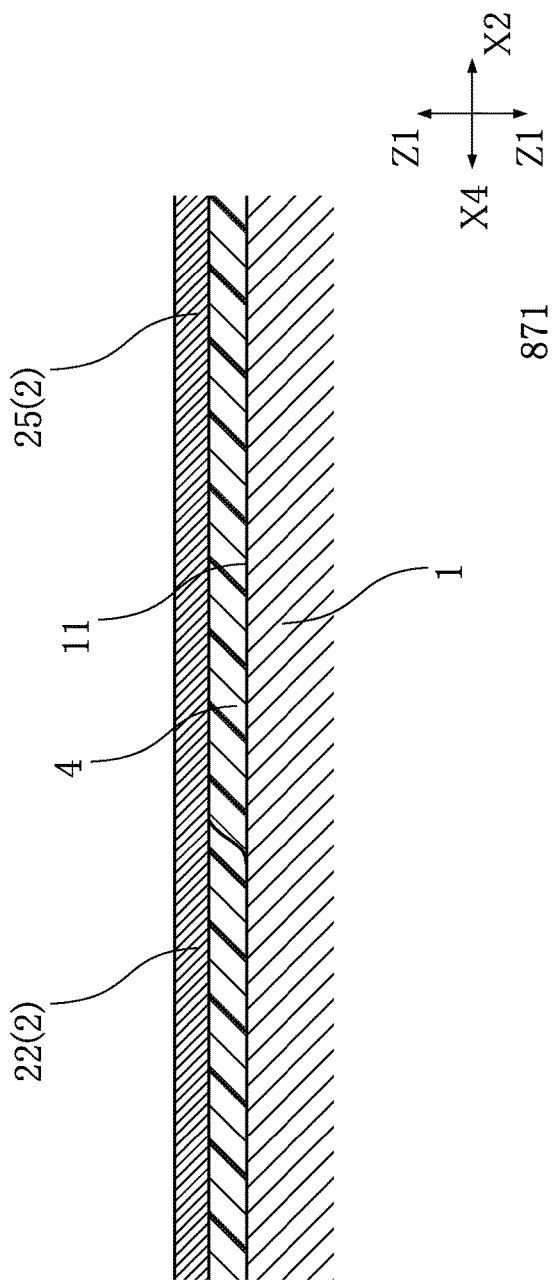
FIG. 10 is another sectional view along line IX-IX in FIG. 2.
Figure 11:
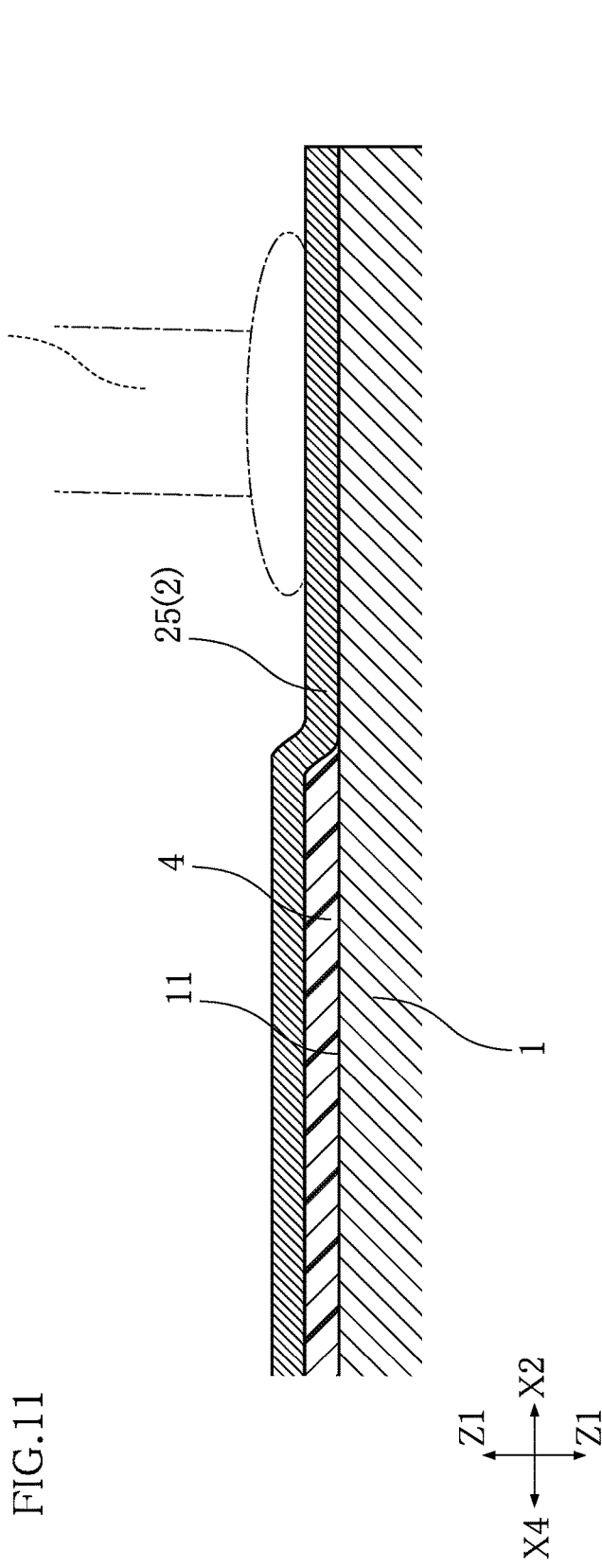
FIG. 11 is a sectional view along line XI-XI in FIG. 2.
Figure 12:
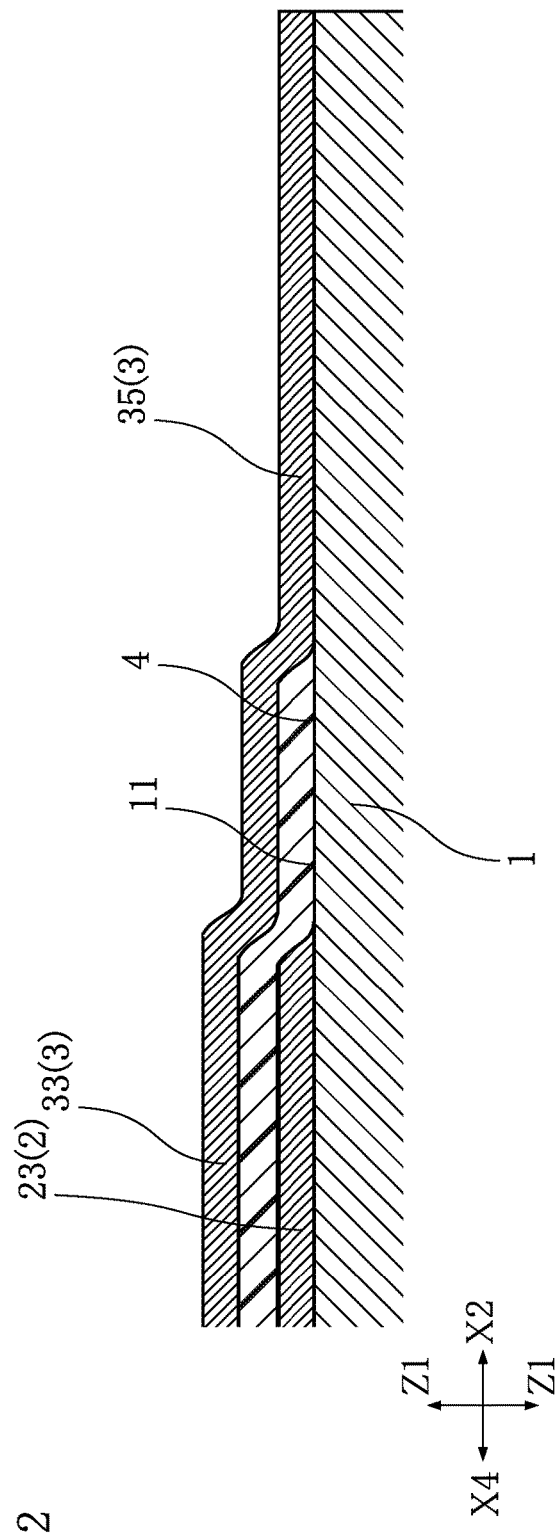
FIG. 12 is a sectional view along line XII-XII in FIG. 2.
Figure 13:
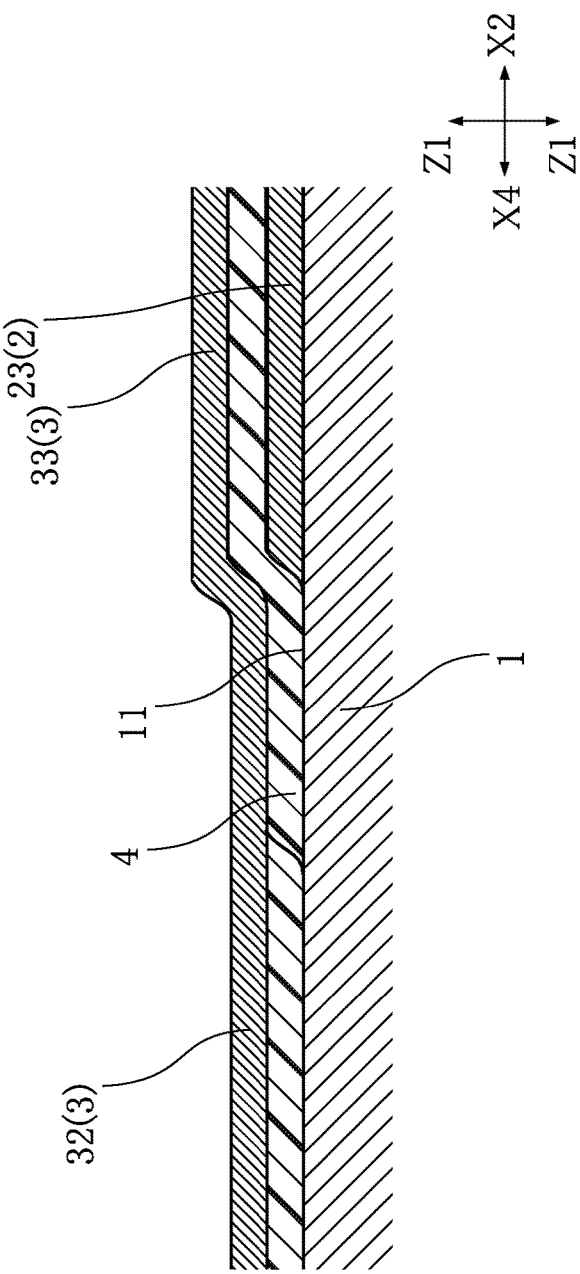
FIG. 13 is another sectional view along line XII-XII in FIG. 2.
Figure 14:
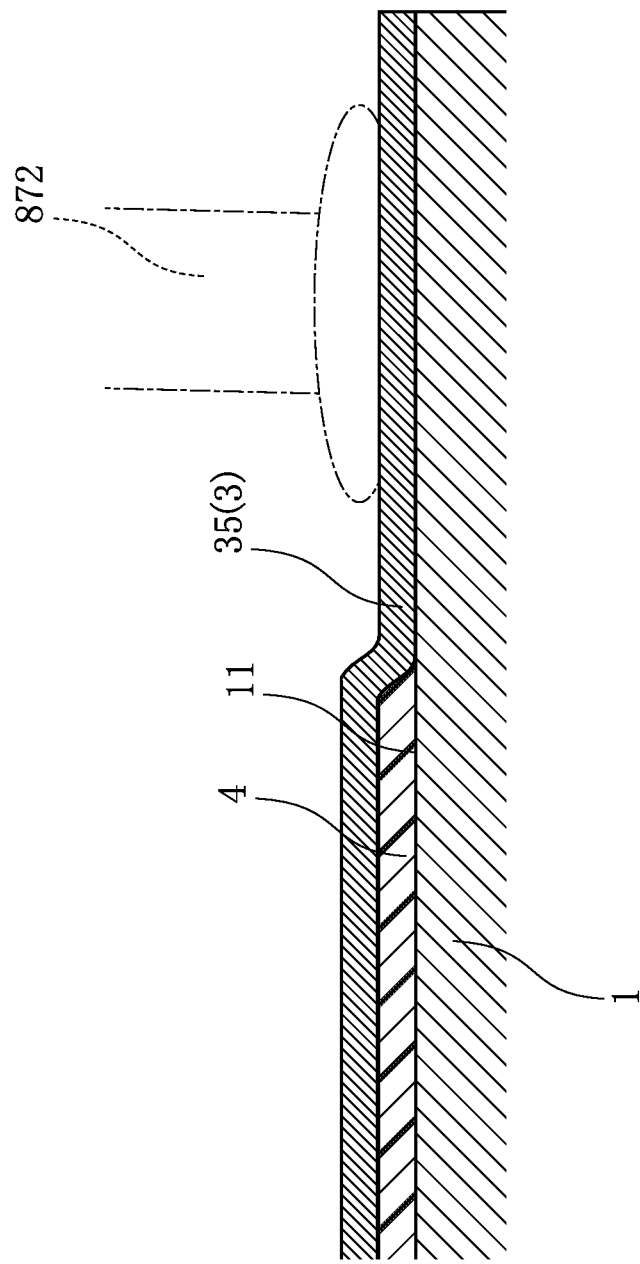
FIG. 14 is a sectional view along line XIV-XIV in FIG. 2.

FIG. 7 is a sectional view along line VII-VII in FIG. 2. FIG. 8 is a sectional view along line VIII-VIII in FIG. 2. FIG. 9 is a sectional view along line IX-IX in FIG. 2. FIG. 10 is another sectional view along line IX-IX in FIG. 2. FIG. 11 is a sectional view along line XI-XI in FIG. 2. FIG. 12 is a sectional view along line XII-XII in FIG. 2. FIG. 13 is another sectional view along line XII-XII in FIG. 2. FIG. 14 is a sectional view along line XIV-XIV in FIG. 2.

The insulating layer 4 shown in FIG. 8 is formed on the semiconductor substrate 1. The insulating layer 4 is made of $SiO_2$, for example. Alternatively, the material forming the insulating layer 4 may be $Si_3N_4$, SiON, $HfO_2$ or $Al_2O_3$. The insulating layer 4 may be approximately 10 nm to 1000 nm in thickness. The insulating layer 4 may be formed by CVD or sputtering, for example.

As shown in FIG. 2, for example, each of the first conductive layer 2 and the second conductive layer 3 is formed on the semiconductor substrate 1. The first conductive layer 2 and the second conductive layer 3 are insulated from each other. As viewed in the thickness direction Z1 of the semiconductor substrate 1, the terahertz element 5 is spaced apart from the second conductive layer 3 in the first direction X1 perpendicular to the thickness direction Z1 of the semiconductor substrate 1. Each of the first conductive layer 2 and the second conductive layer 3 has a metal-laminated structure. For example, each of the first conductive layer 2 and the second conductive layer 3 may be provided by laminating Au, Pd and Ti. Alternatively, each of the first conductive layer 2 and the second conductive layer 3 maybe provided by laminating Au and Ti. Each of the first conductive layer 2 and the second conductive layer 3 may be approximately 10 to 2000 nm in thickness. Each of the first conductive layer 2 and the second conductive layer 3 may be formed by vacuum vapor deposition or sputtering.

The first conductive layer 2 includes a first section 21, a first inductance portion 22, a first capacitor portion 23, and a first electrode 25. The second conductive layer 3 includes a second section 31, a second inductance portion 32, a second capacitor portion 33, and a second electrode 35.

As shown in FIGS. 2, 4, and 5, the first section 21 extends along the first direction X1. The first section 21 includes a first conductive portion 214 and a second conductive portion 215.

In FIGS. 2 and 4, the first conductive portion 214 has an elongated rectangular shape. The first conductive portion 214 extends along the first direction X1 and can function as an antenna. As viewed in the thickness direction Z1, the second conductive portion 215 extends from the first conductive portion 214 toward the second conductive layer 3. As viewed in the thickness direction Z1, the second conductive portion 215 overlaps with the terahertz element 5.

As shown in FIGS. 2 and 4, for example, the first inductance portion 22 is connected to the first section 21 and the first capacitor portion 23 while extending from the first section 21 to the first capacitor portion 23 along the second direction X2. The first inductance portion 22 functions as an inductance. The length L1 (see FIG. 4) of the first inductance portion 22 in the second direction X2 is 5 µm to 100 µm, for example. The width of the first inductance portion 22 is 1 µm to 10 µm, for example.

The second section 31 extends along the third direction X3. The third direction X3 is the direction opposite to the first direction X1. The second section 31 can function as an antenna. The second inductance portion 32 is connected to the second section 31 and the second capacitor portion 33 while extending from the second section 31 to the second capacitor portion 33 along the second direction X2. The second inductance portion 32 functions as an inductance. The length L2 (see FIG. 4) of the second inductance portion 32 in the second direction X2 is 5 µm to 100 µm, for example. The width of the second inductance portion 32 is 1 µm to 10 µm, for example.

As shown in FIGS. 2 and 4, for example, the first capacitor portion 23 is positioned offset from the terahertz element 5 in the second direction X2. In the present embodiment, the first capacitor portion 23 is rectangular as viewed in the thickness direction Z1.

Figure 3:
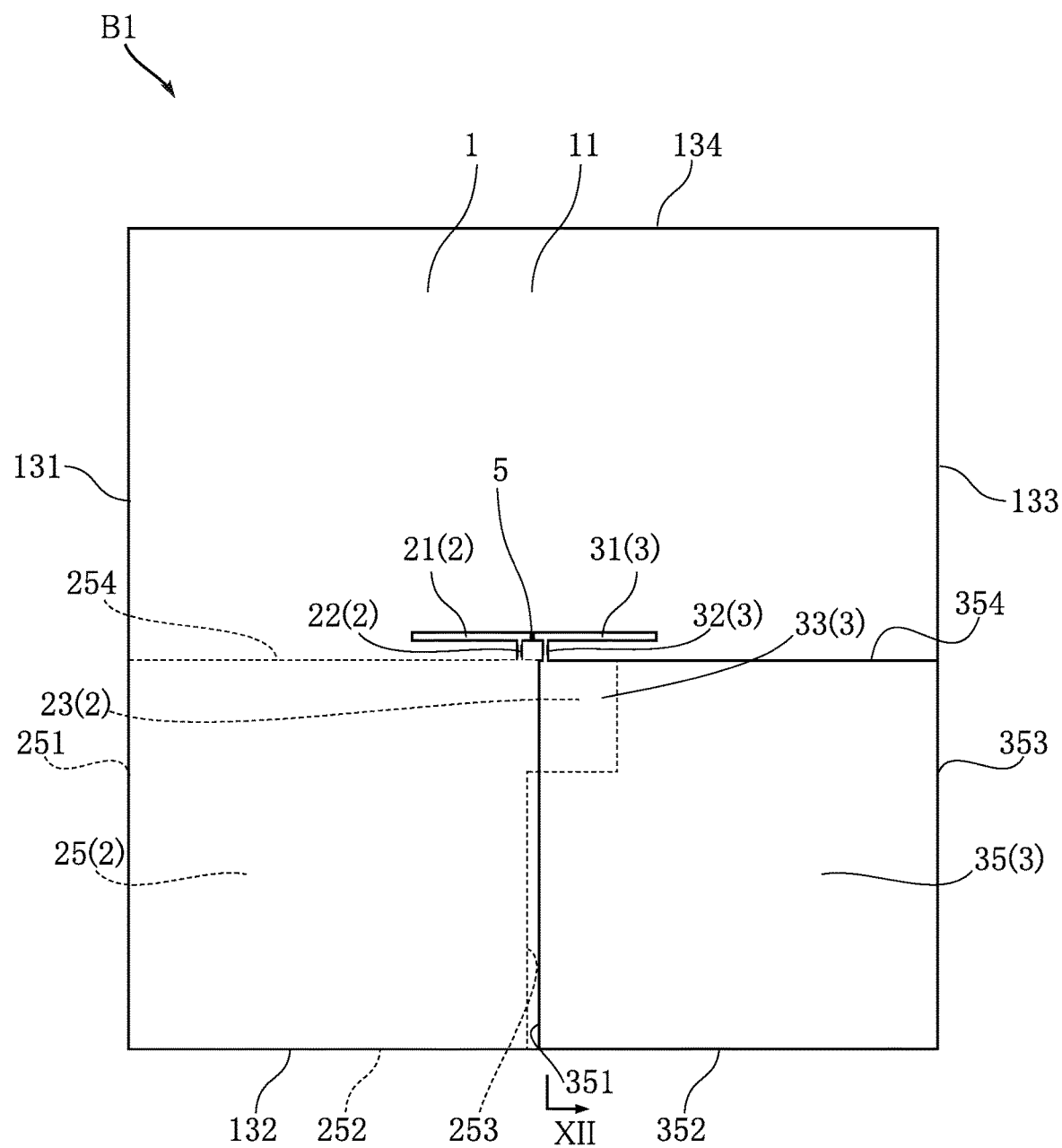
FIG. 3 is a diagram obtained by omitting a first conductive layer from FIG. 2.

FIG. 3 is a diagram obtained by omitting the first conductive layer 2 from FIG. 2.

The second capacitor portion 33 is positioned offset from the terahertz element 5 in the second direction X2. As shown in FIGS. 12 and 13, the first capacitor portion 23 is interposed between the second capacitor portion 33 and the semiconductor substrate 1. Unlike the present embodiment, the second capacitor portion 33 may be interposed between the first capacitor portion 23 and the semiconductor substrate 1. The second capacitor portion 33 is stacked over the first capacitor portion 23 and insulated from the first capacitor portion 23 via the insulating layer 4. The second capacitor portion 33 and the first capacitor portion 23 provide a capacitor. In the present embodiment, the second capacitor portion 33 is rectangular as viewed in the thickness direction Z1.

The first electrode 25 is connected to the first capacitor portion 23. In the present embodiment, the first electrode 25 is rectangular. In the present embodiment, the first electrode 25 is a pad portion to which the wire 871 (see FIG. 1) is bonded. As shown in FIG. 11, the first electrode 25 has a portion that is held in direct contact with the semiconductor substrate 1. As viewed in the thickness direction Z1, this contacting portion overlaps with a wire-bonding portion where the wire 871 and the first electrode 25 are in contact with each other.

In the present embodiment, as shown in FIG. 2, the first electrode 25 includes edges 251-254 as viewed in the thickness direction Z1. Both of the edge 251 and the edge 253 extend along the second direction X2. The edge 252 and the edge 254 are spaced apart from each other in the second direction X2. Both of the edge 252 and the edge 254 extend along the first direction X1. The edge 251 is connected to the edge 252, the edge 252 is connected to the edge 253, the edge 253 is spaced apart from the edge 254, and the edge 254 is connected to the edge 251. As viewed in the thickness direction Z1, the edge 251 and the edge 252 reach the edge 131 and the edge 132, respectively. Unlike the present embodiment, the edge 251 and the edge 252 may not reach the edge 131 and the edge 132 as viewed in the thickness direction Z1.

The second electrode 35 is connected to the second capacitor portion 33. In the present embodiment, the second electrode 35 is rectangular. In the present embodiment, the second electrode 35 is a pad portion to which the wire 872 (see FIG. 14) is bonded. As shown in FIG. 12, the second electrode 35 has a portion that is held in direct contact with the semiconductor substrate 1. As viewed in the thickness direction Z1, this contacting portion overlaps with a wire-bonding portion where the wire 872 and the second electrode 35 are in contact with each other.

In the present embodiment, as shown in FIG. 2, the second electrode 35 reaches the edge 133 and the edge 132 as viewed in the thickness direction Z1. Unlike the present embodiment, the second electrode 35 may not reach the edge 133 and the edge 132 as viewed in the thickness direction Z1. Such an arrangement reduces formation of burrs in the process of manufacturing the semiconductor component B1, which may occur as a result of cutting the second electrode 35 in dicing the semiconductor substrate 1.

In the present embodiment, as shown in FIG. 2, the second electrode 35 includes edges 351-354 as viewed in the thickness direction Z1. Both of the edge 351 and the edge 353 extend along the second direction X2. The edge 352 and the edge 354 are spaced apart from each other in the second direction X2. Both of the edge 352 and the edge 354 extend along the first direction X1. The edge 351 is connected to the edge 352, the edge 352 is connected to the edge 353, the edge 353 is connected to the edge 354, and the edge 354 is spaced apart from the edge 351. As viewed in the thickness direction Z1, the edge 352 and the edge 353 reach the edge 132 and the edge 133, respectively. Unlike the present embodiment, the edge 352 and the edge 353 may not reach the edge 132 and the edge 133 as viewed in the thickness direction Z1.

Figure 15:
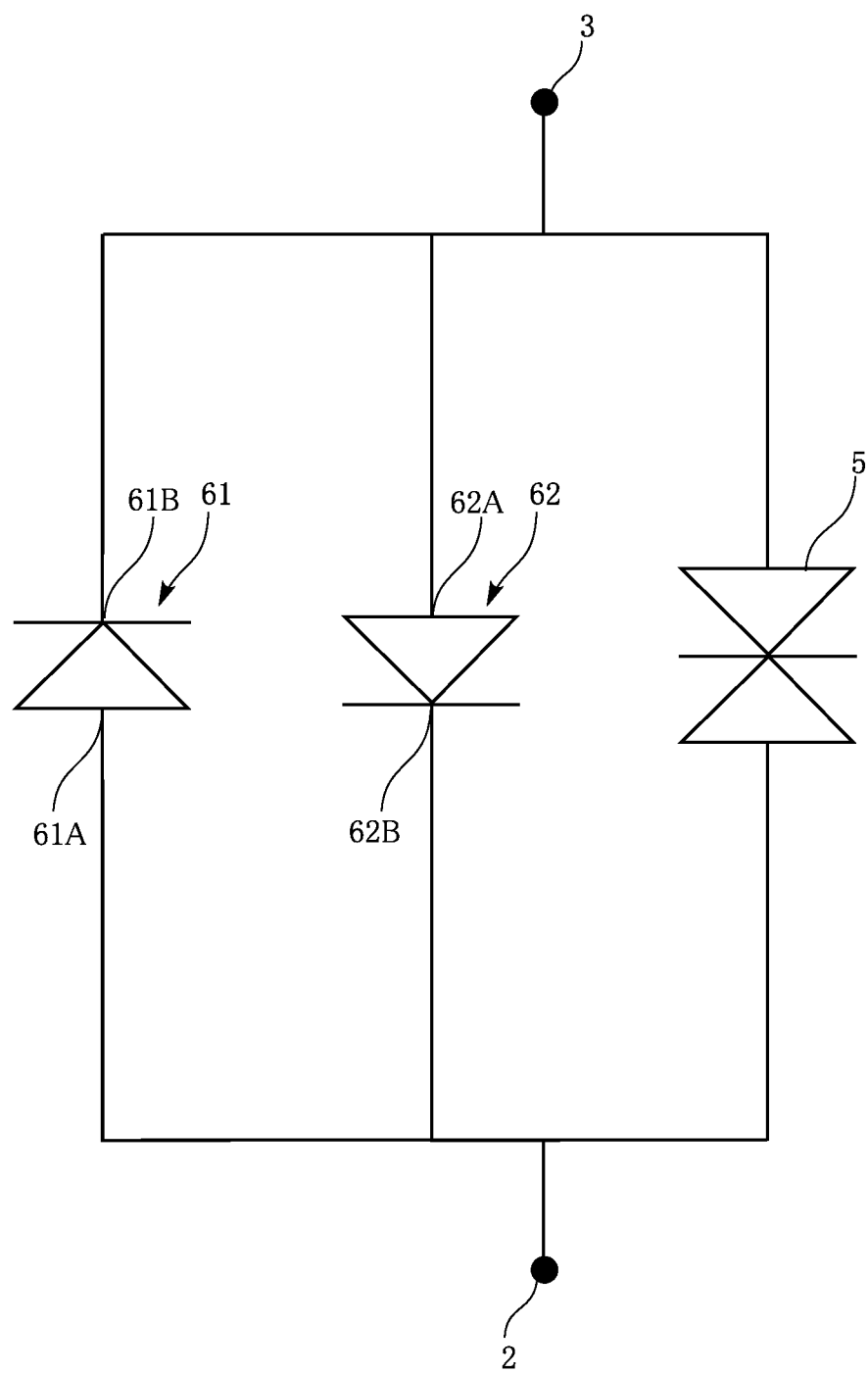
FIG. 15 is a circuit diagram showing the terahertz element, a first rectifying element, and a second rectifying element according to the first embodiment.

FIG. 15 is a circuit diagram showing a terahertz element, a first rectifying element, and a second rectifying element according to the first embodiment. As shown in FIG. 15, the first rectifying element 61 is electrically connected to the terahertz element 5 in parallel. The first rectifying element 61 is a diode, for example. Examples of such a diode include a Zener diode, a Schottky diode, and a light-emitting diode. The first rectifying element 61 includes a first terminal 61A and a second terminal 61B. In the first rectifying element 61, the electrical direction from the first terminal 61A to the second terminal 61B is a forward direction. In normal use, in the first rectifying element 61, a current easily flows from the first terminal 61A to the second terminal 61B, and a current is less likely to flow from the second terminal 61B to the first terminal 61A.

Figure 16:
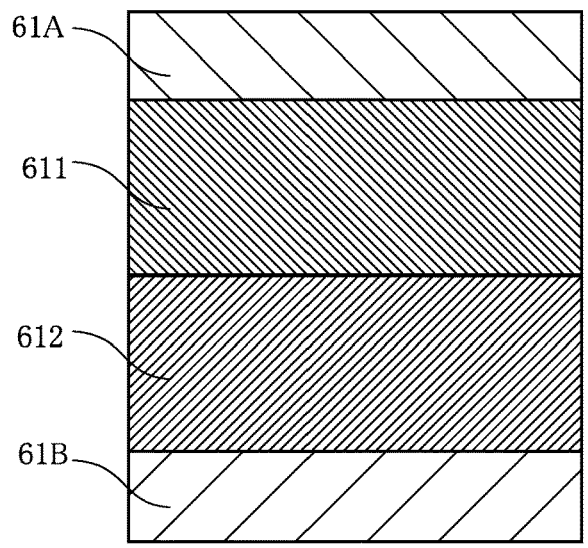
FIG. 16 is a sectional view showing the first rectifying element according to the first embodiment.

FIG. 16 is a sectional view showing an example of the first rectifying element according to the first embodiment. As shown in FIG. 16, the first rectifying element 61 includes a first semiconductor layer 611 and a second semiconductor layer 612. The first semiconductor layer 611 and the second semiconductor layer 612 are stacked on each other. The first semiconductor layer 611 has a first conductive type, and the second semiconductor layer 612 has a second conductive type which is a type opposite to the first conductive type. When the first conductive type is p-type, the second conductive type is n-type. When the second conductive type is n-type, the first conductive type is p-type.

Figure 18:
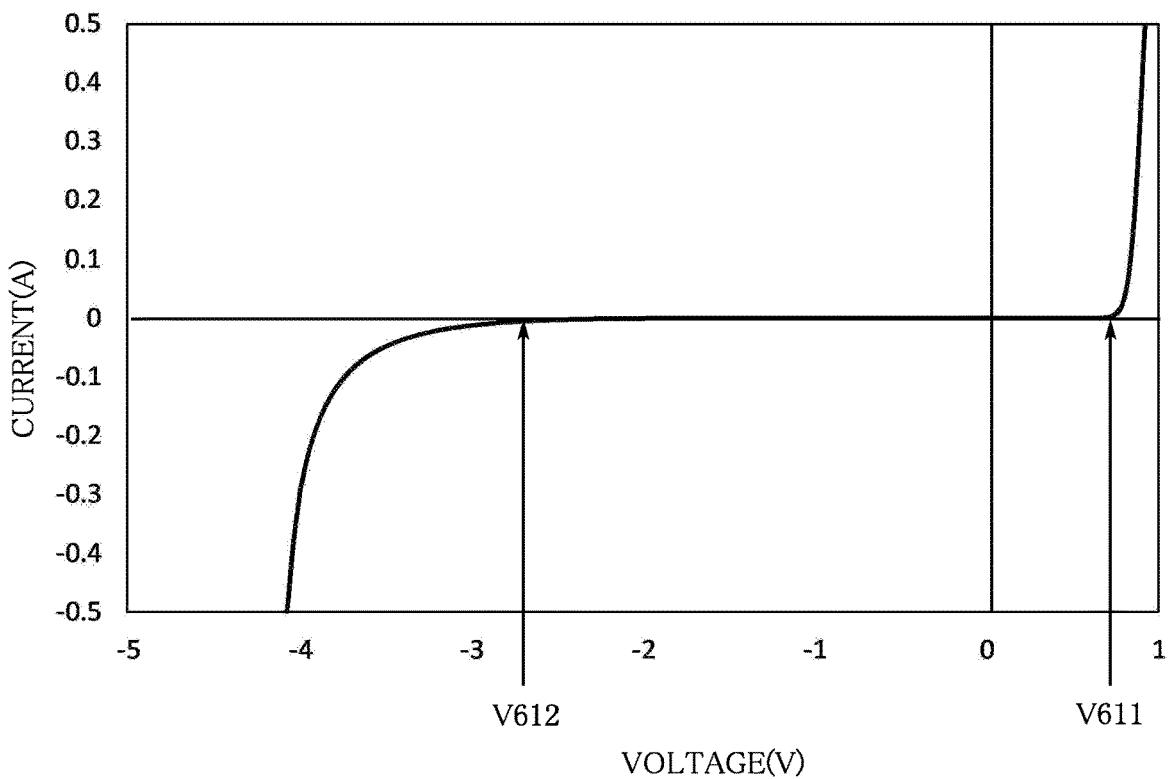
FIG. 18 is a graph showing an example of a current-voltage characteristic of the first rectifying element according to the first embodiment.

FIG. 18 shows a current-voltage characteristic of the first rectifying element 61. In the figure, the direction in which a current flows from the first terminal 61A to the second terminal 61B is defined as a positive direction. As shown in the figure, the absolute value of a first rising voltage value V611 of the first rectifying element 61 is smaller than the absolute value of a first breakdown voltage value V612 of the first rectifying element 61. The first rising voltage value V611 may be larger than the lower limit of the absolute value of a value in the voltage region R11 (the absolute value of a voltage value V11; see FIG. 20) in which the terahertz element 5 radiates terahertz waves. The first rising voltage value V611 may be larger than the upper limit of the absolute value of a value in the voltage region R11 (the absolute value of the voltage value V12; see FIG. 20) in which the terahertz element 5 radiates terahertz waves. The absolute value of the voltage value V11 is 0.3 to 0.5 V, for example. The absolute value of the voltage value V12 is 0.5 to 0.7 V, for example. The absolute value of the first rising voltage value V611 is 0.4 to 0.9 V, for example. The absolute value of the first breakdown voltage value V612 is 2 to 8 V, for example.

As shown in FIG. 15, the second rectifying element 62 is electrically connected to the terahertz element 5 in parallel. The second rectifying element 62 is a diode, for example. Examples of such a diode include a Zener diode, a Schottky diode, and a light-emitting diode. The second rectifying element 62 includes a first terminal 62A and a second terminal 62B. In the second rectifying element 62, the electrical direction from the first terminal 62A to the second terminal 62B is a forward direction. In normal use, in the second rectifying element 62, a current easily flows from the first terminal 62A to the second terminal 62B, and a current is less likely to flow from the second terminal 62B to the first terminal 62A.

Figure 17:
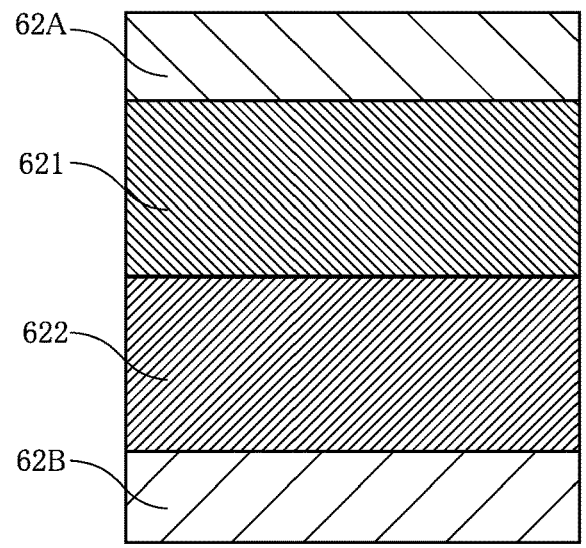
FIG. 17 is a sectional view showing the second rectifying element according to the first embodiment.

FIG. 17 is a sectional view showing an example of the second rectifying element according to the first embodiment. As shown in FIG. 17, the second rectifying element 62 includes a first semiconductor layer 621 and a second semiconductor layer 622. The first semiconductor layer 621 and the second semiconductor layer 622 are stacked on each other. The first semiconductor layer 621 has a first conductive type, and the second semiconductor layer 622 has a second conductive type which is a type opposite to the first conductive type. When the first conductive type is p-type, the second conductive type is n-type. When the second conductive type is n-type, the first conductive type is p-type.

Figure 19:
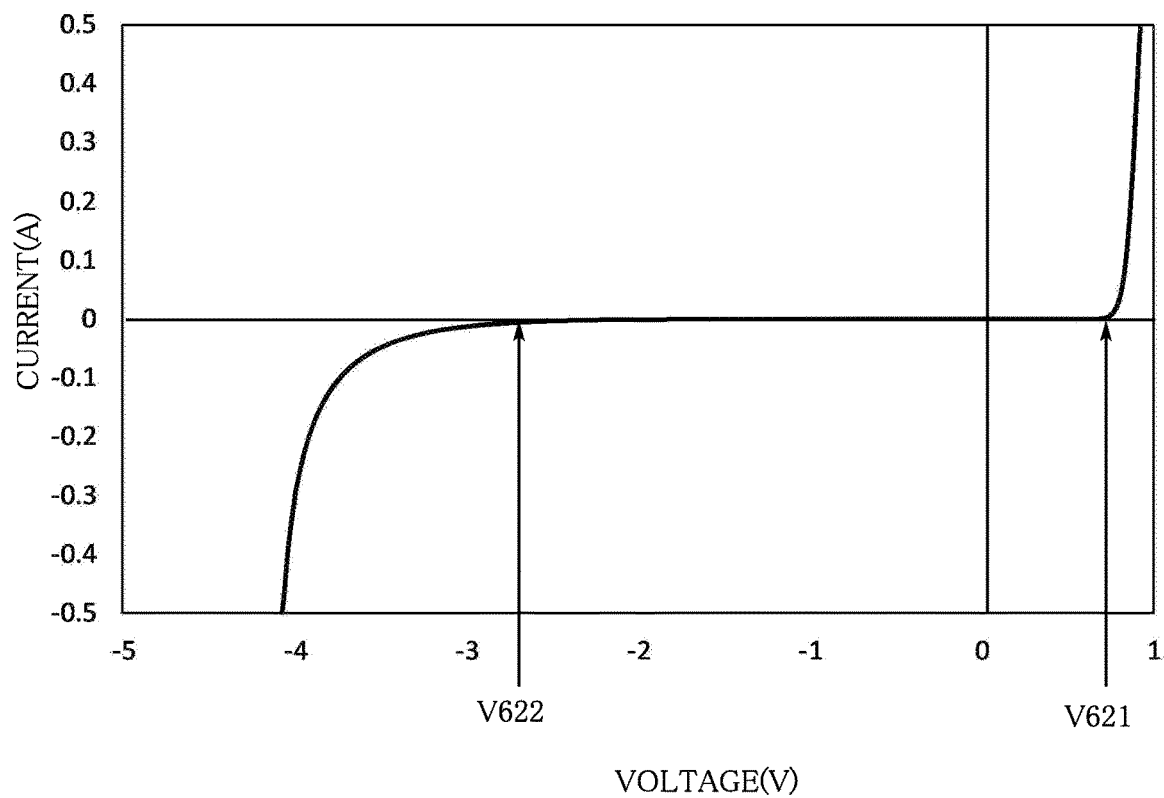
FIG. 19 is a graph showing an example of a current-voltage characteristic of the second rectifying element according to the first embodiment.

FIG. 19 shows a current-voltage characteristic of the second rectifying element 62. In the figure, the direction in which a current flows from the first terminal 62A to the second terminal 62B is defined as a positive direction. As shown in the figure, the absolute value of a second rising voltage value V621 of the second rectifying element 62 is smaller than the absolute value of a second breakdown voltage value V622 of the second rectifying element 62. The second rising voltage value V621 may be larger than the lower limit of the absolute value of a value in the voltage region R11 (the absolute value of the voltage value V11; see FIG. 20) in which the terahertz element 5 radiates terahertz waves. The second rising voltage value V621 may be larger than the upper limit of the absolute value of a value in the voltage region R11 (the absolute value of the voltage value V12; see FIG. 20) in which the terahertz element 5 radiates terahertz waves. The absolute value of the second rising voltage value V621 is 0.4 to 0.9 V, for example. The absolute value of the second breakdown voltage value V622 is 2 to 8 V, for example.

Figure 21:
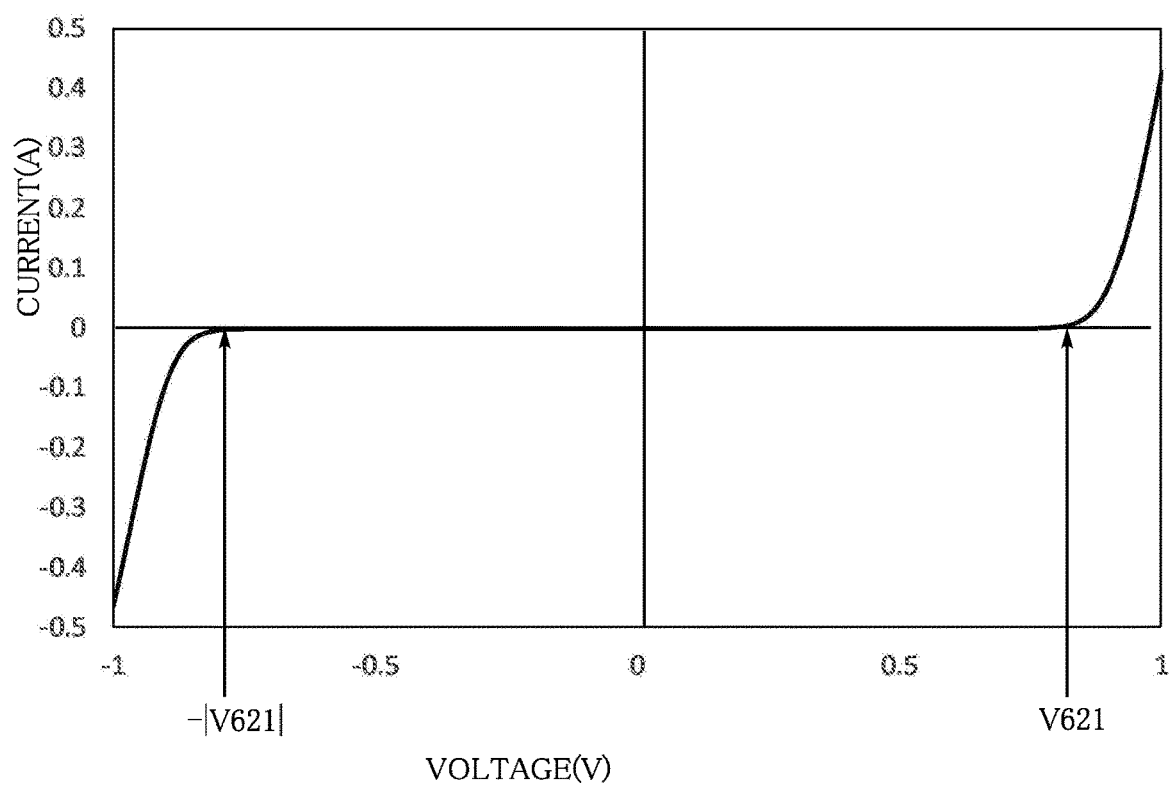
FIG. 21 is a graph showing an example of a current-voltage characteristic of a composite element made up of the first rectifying element and the second rectifying element according to the first embodiment.

As shown in FIG. 15, the first terminal 61A of the first rectifying element 61 is electrically connected to the second terminal 62B of the second rectifying element 62. The second terminal 61B of the first rectifying element 61 is electrically connected to the first terminal 62A of the second rectifying element 62. Accordingly, a current-voltage characteristic of a composite element made up of the first rectifying element 61 and the second rectifying element 62 is as shown in FIG. 21. As shown in FIG. 21, when the direction in which a current flows from the first terminal 61A to the second terminal 61B is defined as a positive direction, the current-voltage curve rises sharply at the first rising voltage value V611, and the current-voltage curve falls sharply at the negative value of the absolute value of the second rising voltage value V621.

Figure 22:
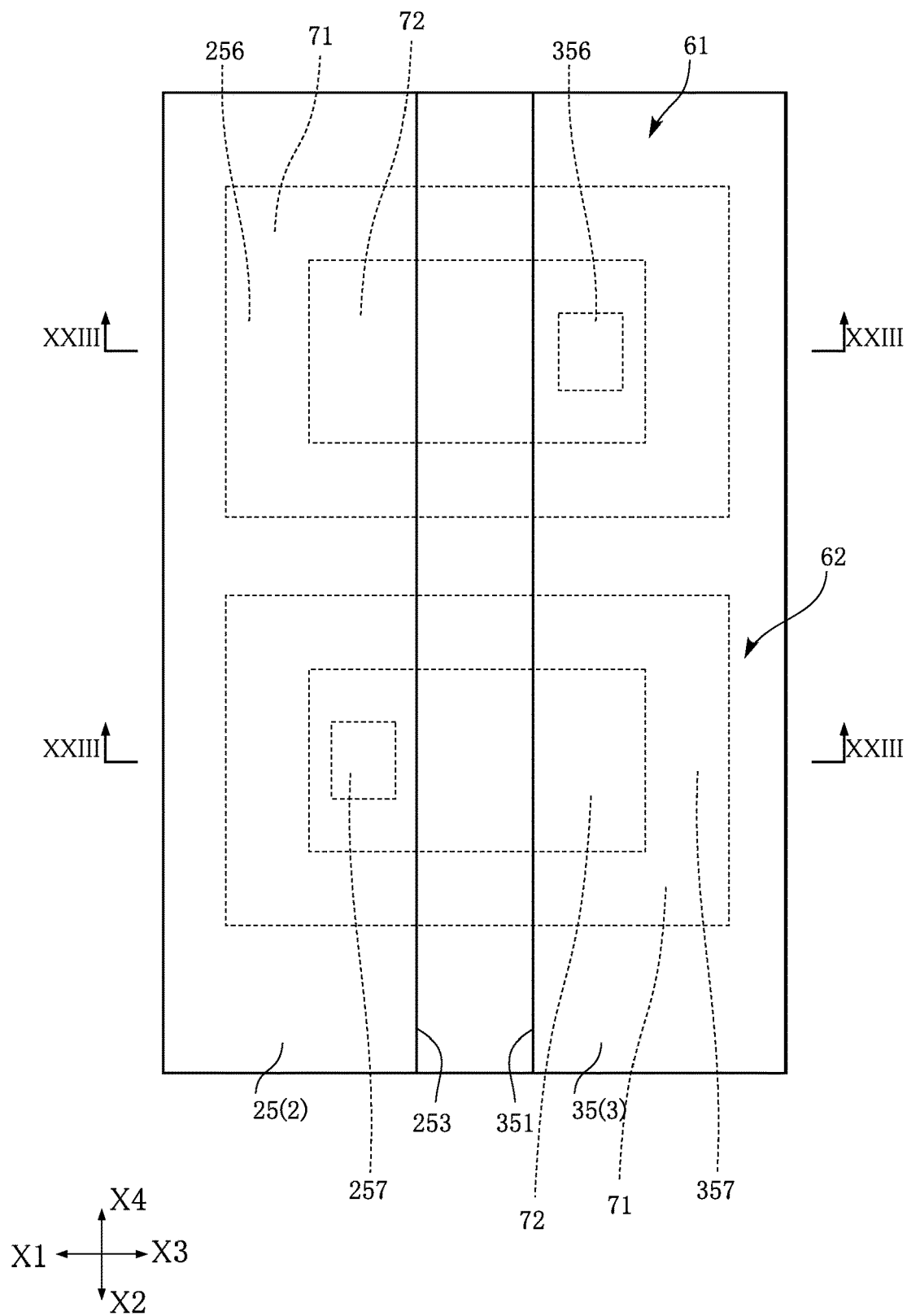
FIG. 22 is a partially enlarged view of region XXII in FIG. 2.
Figure 23:
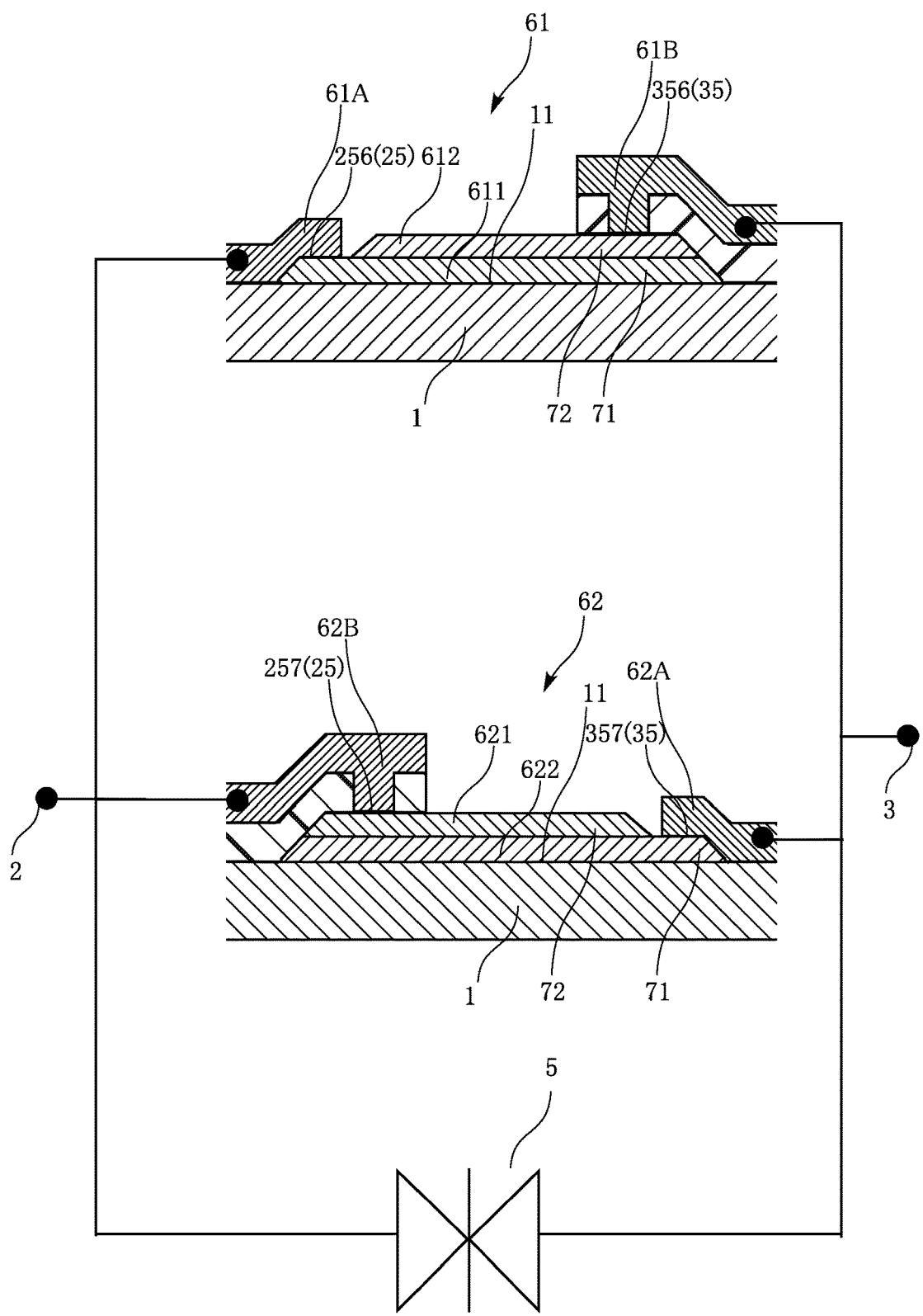
FIG. 23 is a circuit diagram including two sectional views along line XXIII-XXIII in FIG. 22, and shows the terahertz element, the first rectifying element, and the second rectifying element.

The following describes an example of the structure of each of the first rectifying element 61 and the second rectifying element 62. FIG. 22 is a partially enlarged view of region XXII in FIG. 2. FIG. 23 is a circuit diagram including two sectional views along line XXIII-XXIII in FIG. 22, and shows a terahertz element, a first rectifying element, and a second rectifying element.

In the examples shown in FIGS. 2, 22, and 23, both of the first rectifying element 61 and the second rectifying element 62 are formed on the semiconductor substrate 1. Each of the first rectifying element 61 and the second rectifying element 62 is electrically interposed between the first conductive layer 2 (the first electrode 25 in the examples shown in FIGS. 22 and 23) and the second conductive layer 3 (the second electrode 35 in the examples shown in FIGS. 22 and 23). As shown in FIG. 23, the semiconductor substrate 1 is formed with a semiconductor layer 71 (a first semiconductor layer) and a semiconductor layer 72 (a second semiconductor layer). The semiconductor layer 71 and the semiconductor layer 72 are stacked on each other. The semiconductor layer 71 has a first conductive type, and the semiconductor layer 72 has a second conductive type which is a type opposite to the first conductive type. The semiconductor layer 71 may include the first semiconductor layer 611 of the first rectifying element 61 and the first semiconductor layer 621 of the second rectifying element 62. The semiconductor layer 72 may include the second semiconductor layer 612 of the first rectifying element 61 and the second semiconductor layer 622 of the second rectifying element 62.

As shown in FIG. 23, the first conductive layer 2 (more specifically, the first electrode 25) has sections 256 and 257, and the second conductive layer 3 (more specifically, the second electrode 35) has sections 356 and 357. The sections 256 and 357 are in contact with the semiconductor layer 71, and the sections 257 and 356 are in contact with the semiconductor layer 72. In the illustrated example, the section 256 constitutes the first terminal 61A of the first rectifying element 61, and the second electrode 356 constitutes the second terminal 61B of the first rectifying element 61. Also, in the illustrated example, the section 257 constitutes the second terminal 62B of the second rectifying element 62, and the section 357 constitutes the first terminal 62A of the second rectifying element 62.

In FIGS. 22 and 23, the first rectifying element 61 and the second rectifying element 62 are formed between the first electrode 25 and the second electrode 35. However, the first rectifying element 61 and the second rectifying element 62 may be formed between a section other than the first electrode 25 of the first conductive layer 2 and a section other than the second electrode 35 in the second conductive layer 3. Although two rectifying elements, i.e., the first rectifying element 61 and the second rectifying element 62, are formed in the present example, only one of the first rectifying element 61 and the second rectifying element 62 may be formed instead. Furthermore, although two rectifying elements, i.e., the first rectifying element 61 and the second rectifying element 62, are formed in the present example, another element maybe electrically connected to the terahertz element 5 in series or in parallel, in addition to the first rectifying element 61 and the second rectifying element 62.

Figure 24:
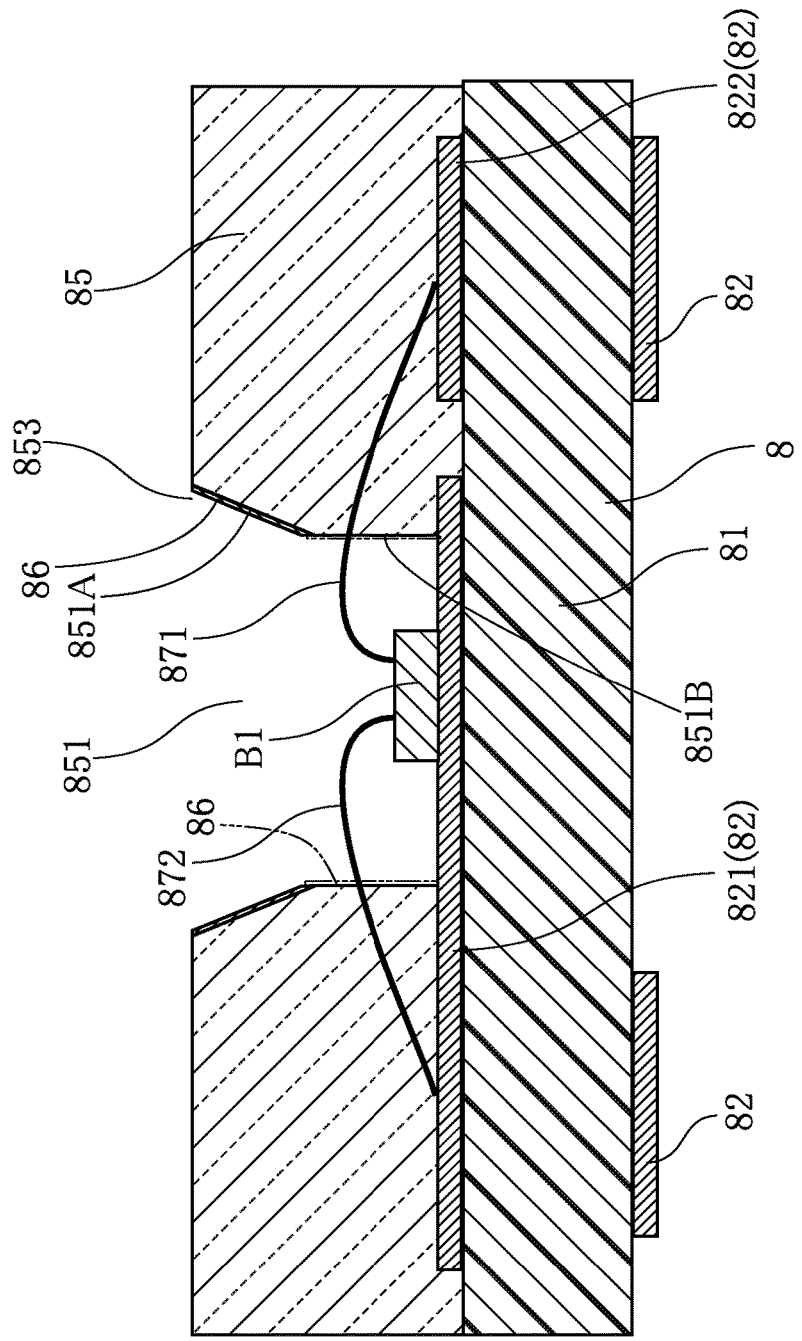
FIG. 24 is a sectional view showing the terahertz device according to the first embodiment.

FIG. 24 is a sectional view of a terahertz device according to the first embodiment. As shown in FIG. 24, the semiconductor component B1 is disposed on the support 8. The support 8 includes a wiring board 81 and a conductive layer 82. The wiring board 81 is a glass epoxy board, for example. The semiconductor component B1 is disposed on the wiring board 81. The conductive layer 82 is formed on the wiring board 81. The conductive layer 82 includes a first conductive element 821 and a second conductive element 822. The first conductive element 821 and the second conductive element 822 are spaced apart from each other. The support 8 may not include the glass epoxy board. The support 8 may include one or more leads from a lead frame.

The resin member 85 is disposed on the wiring board 81. The resin member 85 is made of epoxy resin, for example. The resin member 85 has a surface 853. The surface 853 faces one side in the thickness direction of the wiring board 81 (which corresponds to the thickness direction Z1 of the semiconductor substrate 1 in the present embodiment). The resin member 85 has a space 851 that houses the semiconductor component B1. The space 851 has a first side surface 851A and a second side surface 851B. The first side surface 851A is inclined with respect to the thickness direction Z1. The second side surface 851B is positioned between the first side surface 851A and the wiring board 81 in the thickness direction Z1. The second side surface 851B extends along the thickness direction Z1 of the wiring board 81. The dimension of the second side surface 851B in the thickness direction Z1 is larger than the dimension of the semiconductor component B1 in the thickness direction Z1.

It is preferable to provide a metal layer 86 on the first side surface 851A. The metal layer 86 may also be provided on the second side surface 851B. The metal layer 86 may be formed by metal plating. The metal layer 86 efficiently reflects terahertz waves. The wires 871 and 872 are bonded to the semiconductor component B1 and the wiring board 81 (more specifically, the conductive layer 82). The wire 871 is bonded to the first electrode 25 of the semiconductor component B1 and the second conductive element 822 in the conductive layer 82. The wire 872 is bonded to the second electrode 35 of the semiconductor component B1 and the first conductive element 821 in the conductive layer 82. Unlike the illustrated example, the first side surface 851A and the second side surface 851B may be made of metal.

Next, advantages of the present embodiment will be described.

In the present embodiment, the terahertz device A1 includes the first rectifying element 61 that is electrically connected to the terahertz element 5 in parallel. Such an arrangement can allow a current to flow through the first rectifying element 61, even if a large voltage is applied across the terahertz element 5 due to static electricity or the like. This prevents a large current to flow through the terahertz element 5, avoiding damage to the terahertz element 5 due to static electricity or the like.

In the present embodiment, the terahertz device A1 includes the second rectifying element 62 that is electrically connected to both of the terahertz element 5 and the first rectifying element 61 in parallel, as shown in FIG. 15. Such an arrangement can avoid damage to the terahertz element 5 due to static electricity or the like, for the same reason as described above.

In the present embodiment, the electrical direction from the first terminal 61A to the second terminal 61B in the first rectifying element 61 is a forward direction. In the second rectifying element 62, the electrical direction from the first terminal 62A to the second terminal 62B is a forward direction. The first terminal 61A of the first rectifying element 61 is electrically connected to the second terminal 62B of the second rectifying element 62. With such an arrangement, when a very large voltage that causes the voltage of the first terminal 61A to be positive with respect to the second terminal 61B is applied across the terahertz element 5, a current flows through the first rectifying element 61 from the first terminal 61A to the second terminal 61B. When a very high voltage that causes the voltage of the first terminal 61A to be negative with respect to the second terminal 61B is applied across the terahertz element 5, a current flows through the second rectifying element 62 from the first terminal 62A to the second terminal 62B. This reduces the possibility of an excessive current flowing through the terahertz element 5, regardless of whether the voltage that can be applied to the terahertz element 5 is positive or negative. As a result, damage to the terahertz element 5 due to static electricity or the like can be more effectively avoided.

In the present embodiment, both of the first rectifying element 61 and the second rectifying element 62 are formed on the semiconductor substrate 1. Such an arrangement can be realized while minimizing an increase in the size of the semiconductor substrate 1. Accordingly, the present embodiment is suitable for avoiding an increase in the size of the terahertz device A1.

<Variations>

In the following descriptions, the structures that are identical or similar to the above are denoted by the same reference signs as the above, and descriptions thereof are omitted appropriately.

Figure 25:
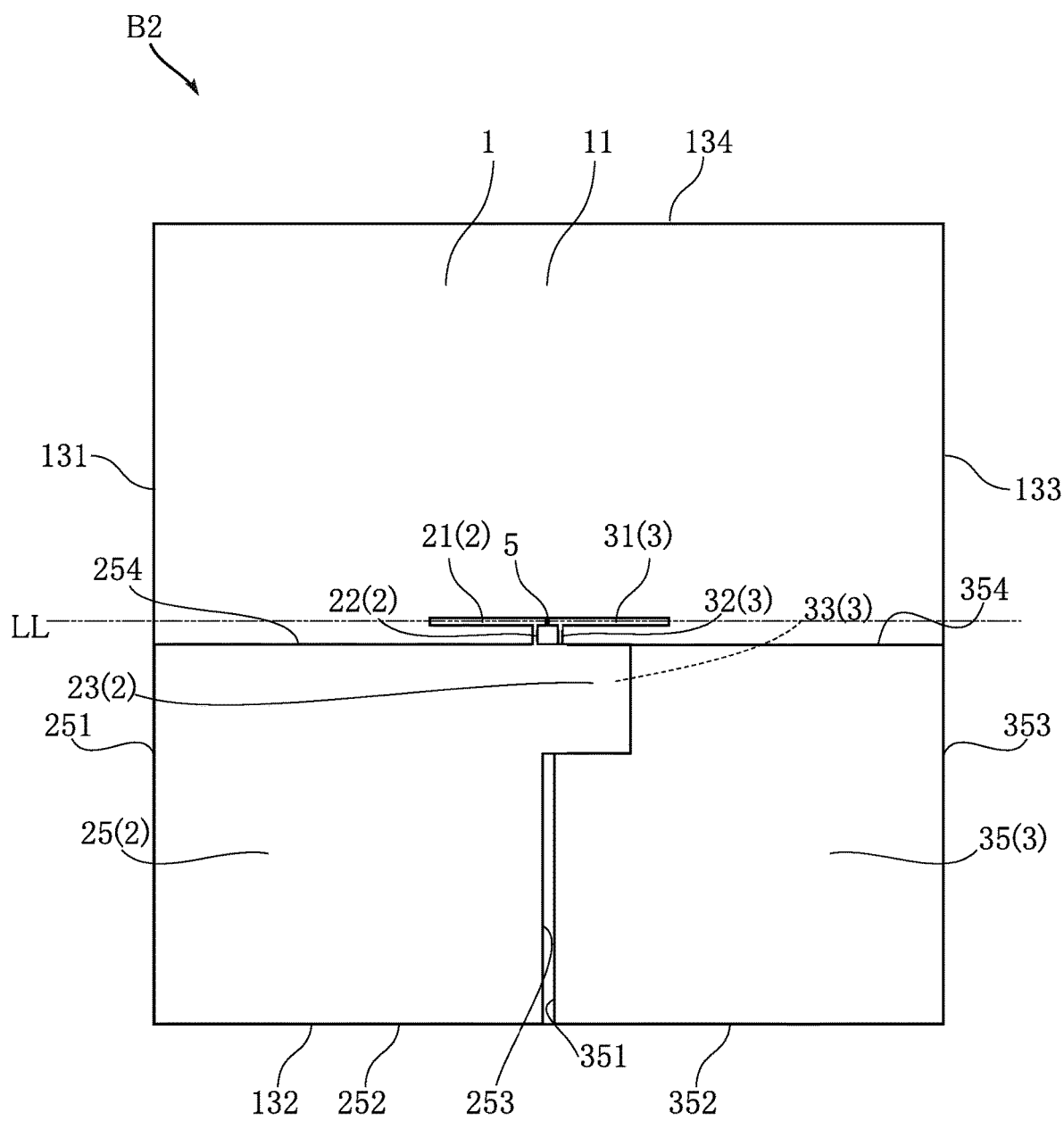
FIG. 25 is a plan view showing a semiconductor component according to a first variation of the first embodiment.

The structures in the following variations are different from the structure shown in FIG. 2 in that the first rectifying element 61 and the second rectifying element 62 are not formed on the semiconductor substrate 1, as shown in FIG. 25. Since all the other structures are basically the same as those described above, descriptions thereof are omitted. The electrical arrangement of the terahertz element 5, the first rectifying element 61, and the second rectifying element 62 is as shown in FIG. 15. Descriptions on the structures in the above embodiment with the figures except FIGS. 22 and 23 are applicable to descriptions on the structures in the following variations.

Figure 26:
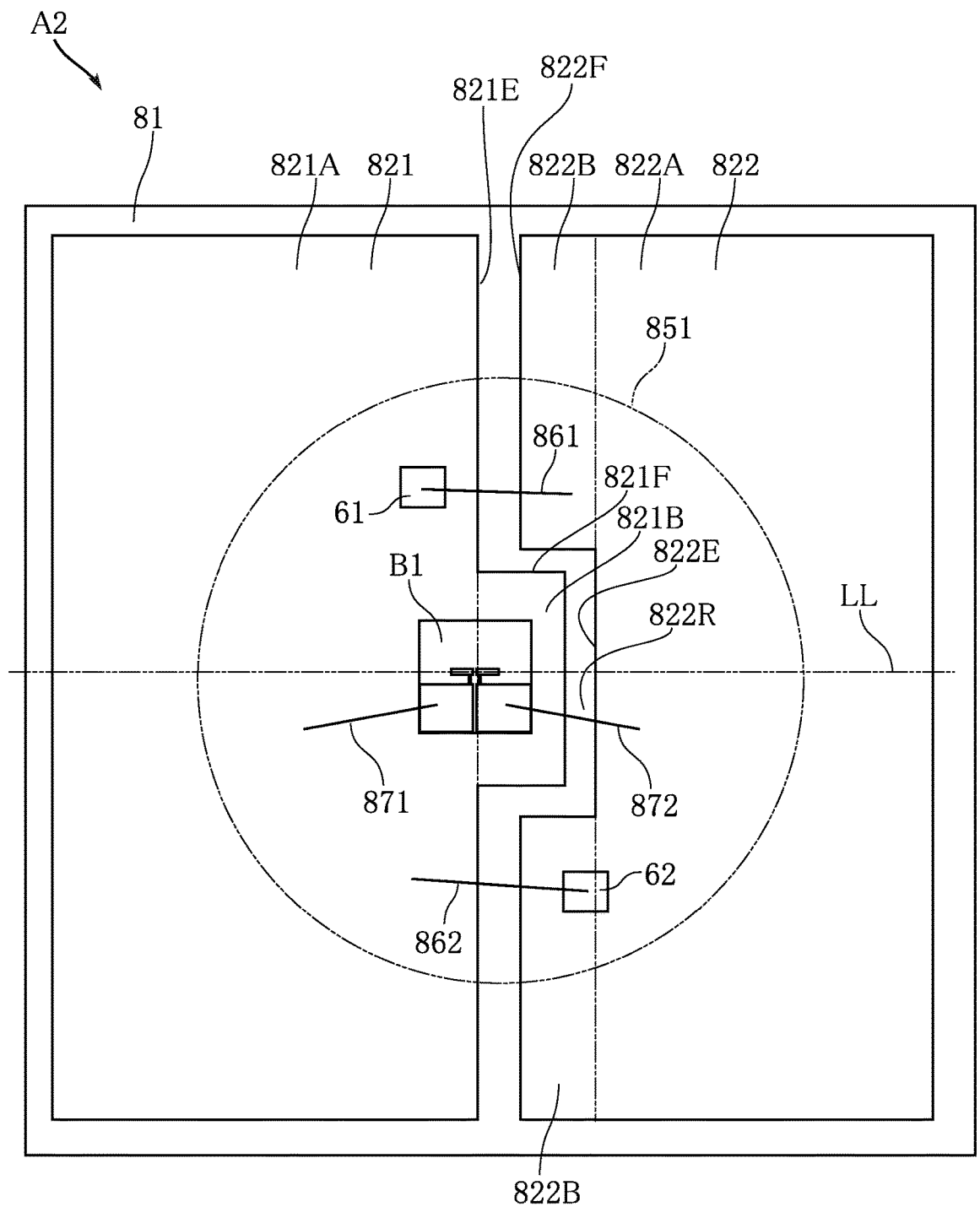
FIG. 26 is a plan view showing a terahertz device according to the first variation of the first embodiment.

FIG. 26 is a plan view showing a terahertz device according to a first variation of the first embodiment. In a terahertz device A2 shown in FIG. 26, the first conductive element 821 includes a first section 821A and a second section 821B. An imaginary boundary between the first section 821A and the second section 821B is indicated by a two-dot chain line extending longitudinally in FIG. 26. The first section 821A includes an edge 821E. The first section 821A extends along the longitudinal direction in FIG. 26. The second section 821B extends from the first section 821A toward the second conductive element 822. The second section 821B includes an edge 821F. The edge 821F is connected to the edge 821E. In this figure, the first rectifying element 61 is disposed on the first section 821A. The terahertz element 5 is disposed on the first section 821A and the second section 821B.

In FIG. 26, the second conductive element 822 includes a first section 822A and two second sections 822B. An imaginary boundary between the first section 822A and the second sections 822B is indicated by a two-dot chain line extending longitudinally in FIG. 26. A portion of the first section 822A faces the second section 821B. The first section 822A includes an edge 822E. The second sections 822B extend from the first section 822A toward the first conductive element 821. Each of the second sections 822B includes an edge 822F. A portion of each second section 822B faces the first section 821A. The edge 822F is connected to the edge 822E. In FIG. 26, the first section 822A and the two second sections 822B form a recess 822R. The second section 821B of the first conductive element 821 is positioned within the recess 822R. In this figure, the second rectifying element 62 is disposed on the first section 822A and one of the second sections 822B.

A wire 861 is bonded to the first rectifying element 61 and one of the second sections 822B of the second conductive element 822. A wire 862 is bonded to the second rectifying element 62 and one of the second sections 822B of the second conductive element 822. The wire 871 is bonded to the semiconductor component B1 and the first section 821A of the first conductive element 821. The wire 872 is bonded to the semiconductor component B1 and the first section 822A of the second conductive element 822. The wires 861, 862, 871, and 872 are formed while avoiding an imaginary straight line LL that extends along the first section 21 and the second section 31 (each of which can function as an antenna in the present embodiment) in plan view. In the illustrated example, the wires 861, 862, 871, and 872 do not intersect with the imaginary straight line LL that extends along the first section 21 and the second section 31 (each of which can function as an antenna in the present embodiment) in plan view. In plan view, the first rectifying element 61 and the second rectifying element 62 are disposed on opposite sides with the imaginary straight line LL therebetween.

In the present variation, the wires 861, 862, 871, and 872 are formed while avoiding the imaginary straight line LL that extends along the first section 21 and the second section 31 (each of which can function as an antenna in the present embodiment) in plan view. With such an arrangement, the wires 861, 862, 871, and 872 have less influence on the oscillation (or reception) of terahertz waves. One of the reasons why these wires have less influence may be because the conductors (i.e., wires) do not easily affect the electromagnetic field formed in association with the first section 21 and the second section 31 (each of which can function as an antenna in the present embodiment).

In the present variation, the first rectifying element 61 and the second rectifying element 62 are disposed on opposite sides with the imaginary straight line LL therebetween in plan view. With such an arrangement, the semiconductor component B1 can be more easily disposed toward the center of the support 8 in plan view. Thus, it is possible to reduce the area of the support 8 in plan view while not easily affecting the oscillation (or reception) of terahertz waves.

Figure 27:
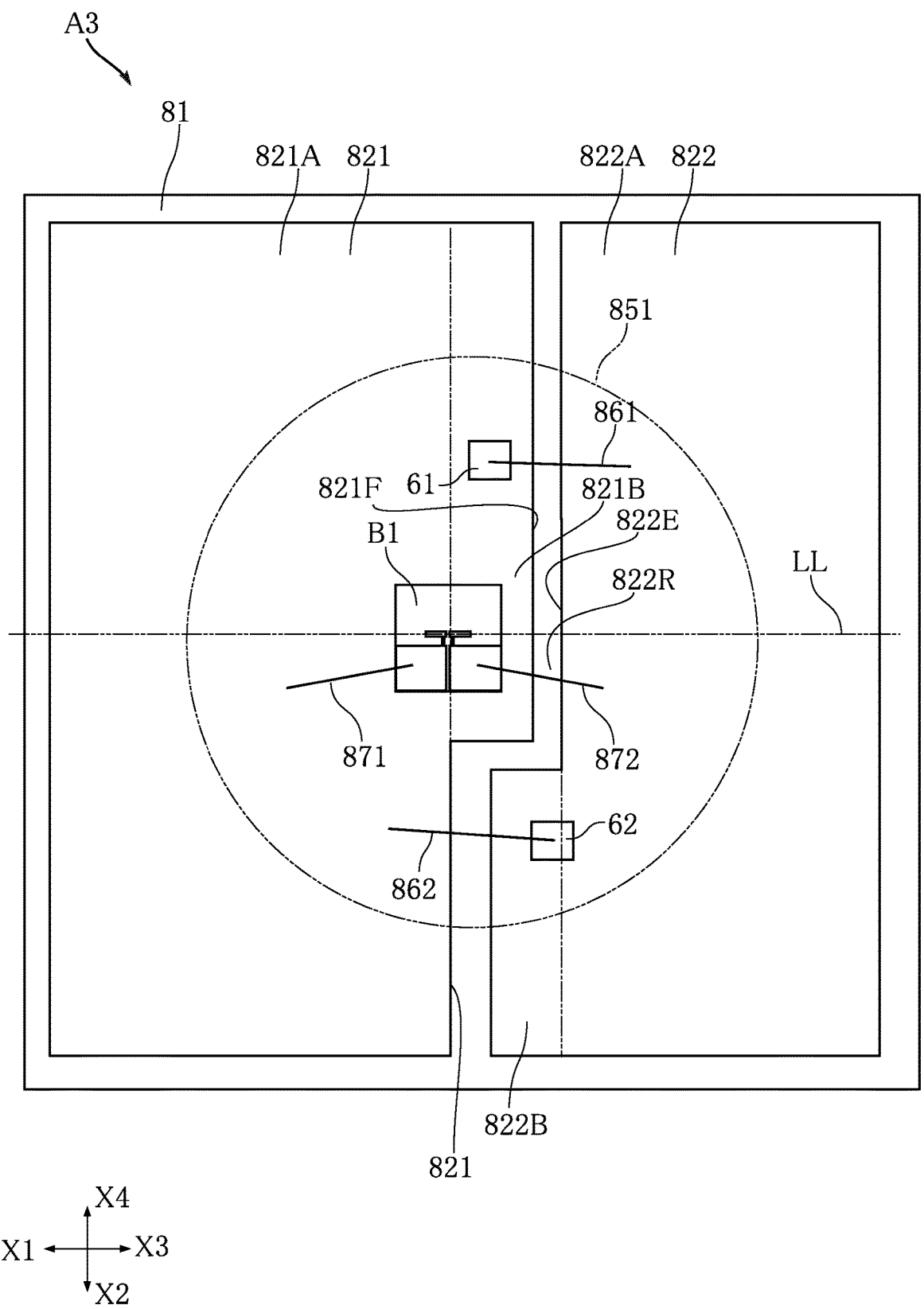
FIG. 27 is a plan view showing a terahertz device according to a second variation of the first embodiment.

In the variation shown in FIG. 27, portions of the first conductive element 821 and the second conductive element 822 are different in shape. In FIG. 27, the first rectifying element 61 is disposed on the second section 821B. The semiconductor component B1 is disposed on the first section 821A and the second section 821B. Such an arrangement allows the first rectifying element 61 to be disposed toward the right side in FIG. 27, thus reducing the area of the support 8 in plan view as compared to the arrangement in the variation shown in FIG. 26.

Figure 28:
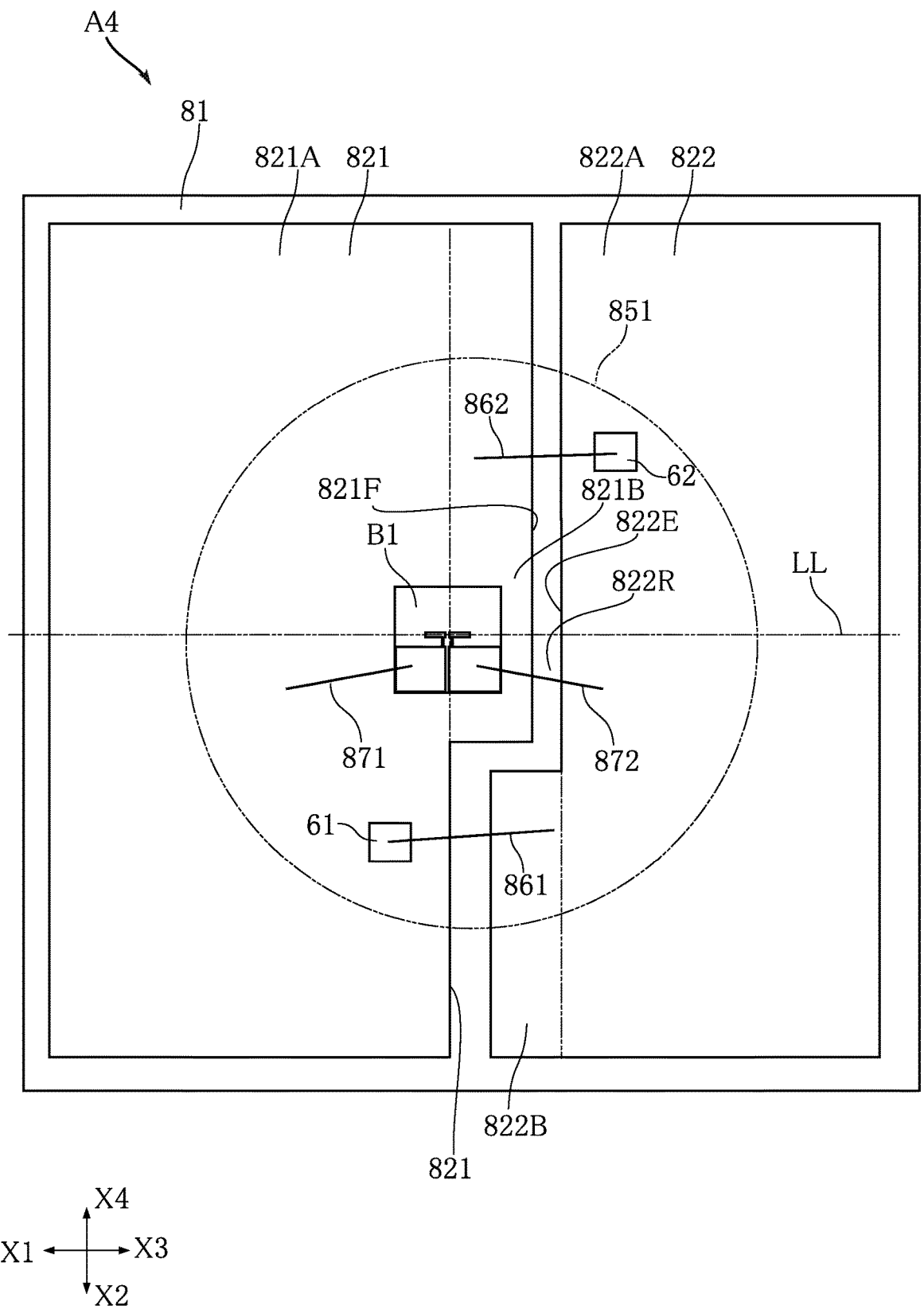
FIG. 28 is a plan view showing a terahertz device according to a third variation of the first embodiment.

The first rectifying element 61 and the second rectifying element 62 may be disposed as shown in a variation in FIG. 28.

According to an example in the present disclosure, the terahertz device includes the support and the resin member. However, the terahertz device may be a chip-type device corresponding to the semiconductor device of the present disclosure.

Figure 29:
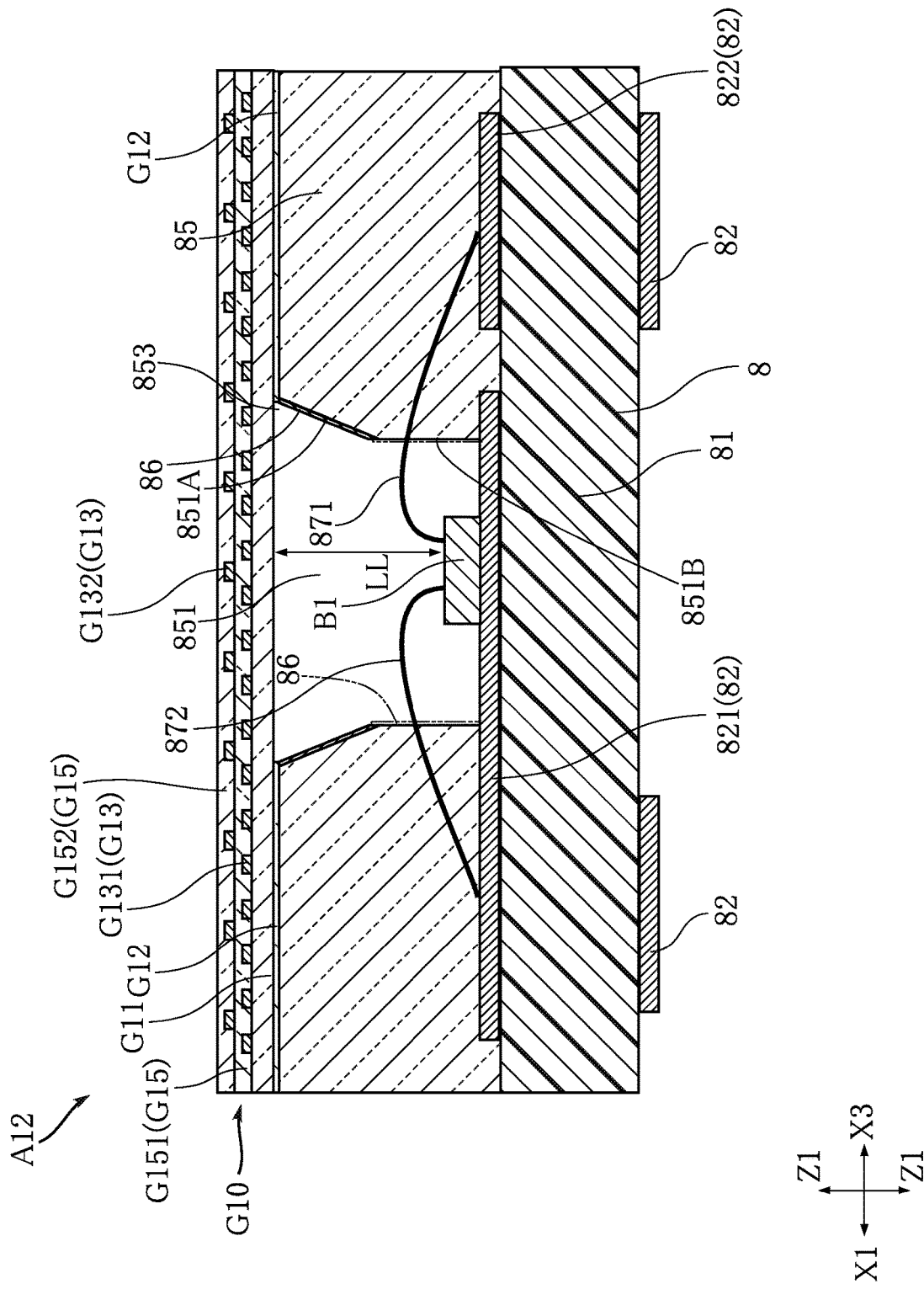
FIG. 29 is a sectional view showing a terahertz device according to another variation of the first embodiment.

FIG. 29 shows another variation. A terahertz device A12 in FIG. 29 differs from the terahertz device A1 in FIG. 24 in further including a member G10. The structure in the present variation may be combined with a terahertz device other than the terahertz device A1 shown in FIG. 24.

Figure 39:
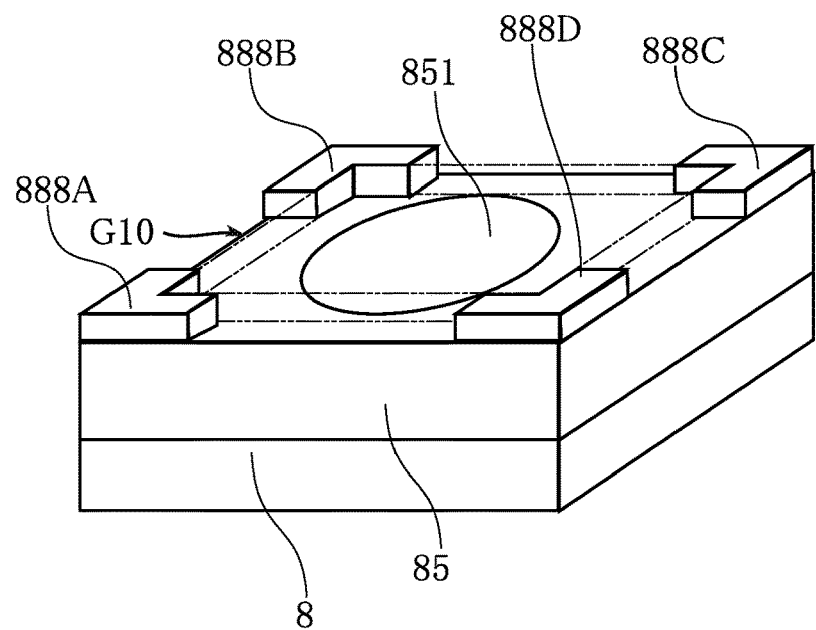
FIG. 39 is a perspective view showing a terahertz device according to a variation of the first embodiment.
Figure 40:
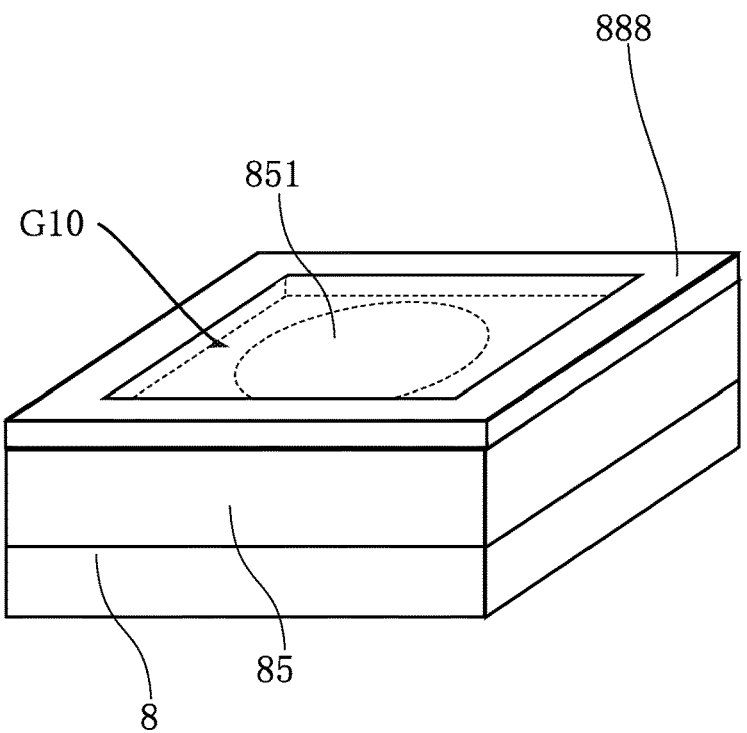
FIG. 40 is a perspective view showing a terahertz device according to a variation of the first embodiment.

As shown in FIG. 29, the member G10 is disposed on the resin member 85. The member G10 is exposed to the space 851. In the present variation, the space 851 is defined by the resin member 85 and the member G10. In the present variation, the space 851 formed in the resin member 85 is filled with gas. Specific examples of the gas include an inert gas (e.g., nitrogen) and air. Although the member G10 has a plate-like shape in the present variation, it may have another shape. The member G10 may be formed on the resin member 85 via a bonding layer G12. The space 851 may be sealed by the member G10 (and the bonding layer G12). As shown in FIGS. 39 and 40, at least one section (sections 888A-888D in FIG. 39; section 888 in FIG. 40) for fitting the member G10 therein may be formed on the resin member 85 so as to easily dispose the member G10 on the resin member 85.

As shown in FIG. 29, in the present variation, the member G10 includes a first portion G11, a second portion G13, and a third portion G15.

The first portion G11 is made of an insulating material, for example. The first portion G11 may be a substrate (examples of which include a sheet and a film). It is preferable that the material of the first portion G11 have a low absorption loss for terahertz waves and a high transmittance for terahertz waves. For example, a thin-film sheet having a low permittivity or a Si substrate having a high resistivity may be used as a substrate constituting the first portion G11. When a Si substrate is used, a laminate structure can be easily formed. Other examples of the material constituting the first portion G11 include a polymer and MgO. When a polymer is used, the first portion G11 can be formed by shaping the polymer into a sheet and transferring a pattern onto the sheet. When MgO is used, an absorption loss for terahertz waves can be advantageously reduced. Alternatively, a compound semiconductor (e.g., SiC, GaN, GaAs, InP, or sapphire) may be used as the material of the first portion G11. It is possible to increase the resistivity of the compound semiconductor by adjusting the amount of a dopant introduced in the compound semiconductor.

The second portion G13 is made of a conductive material (e.g., Cu, Al, or Au), for example. The second portion G13 can exhibit a desired function for terahertz waves. Specifically, the second portion G13 can exhibit at least one of a terahertz waveband polarization function, a frequency filter function, and a plane lens function.

The second portion G13 may include a plurality of layers. In the example shown in FIG. 29, the second portion G13 includes layers G131 and G132. The plurality of layers G131 and G132 are disposed at different positions in the direction Z1 in FIG. 29 (i.e., at different heights). Each of the layers G131 and G132 may exhibit a desired function. The layers G131 and G132 may either have different shapes or the same shape in plan view, and may either have different functions or the same functions. Unlike the structure shown in FIG. 29, the second portion G13 may have a structure with only one layer (e.g., only the layer G131). Alternatively, the second portion G13 may include three or more layers.

The second portion G13 may include at least one among a belt-like portion, an annular portion, and a dot in plan view. FIGS. 30 to 34 show specific examples of the shape of the second portion G13 in plan view. Each of the layers G131 and G132 in FIG. 29 may have any of the shapes in FIGS. 30 to 34 described below.

Figure 30:
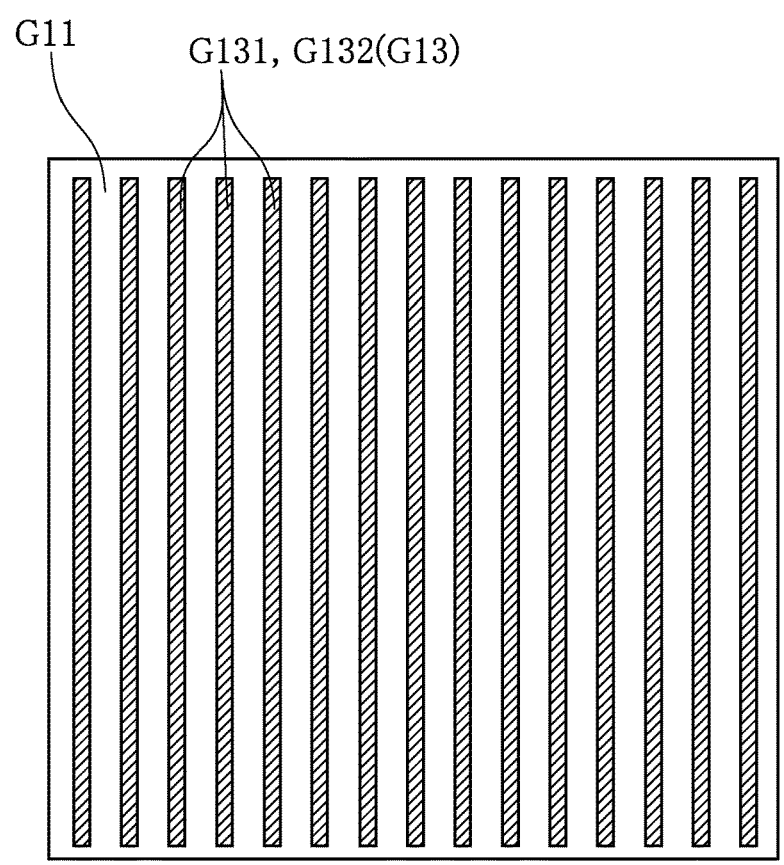
FIG. 30 shows an example of the shape of a second portion in plan view.
Figure 31:
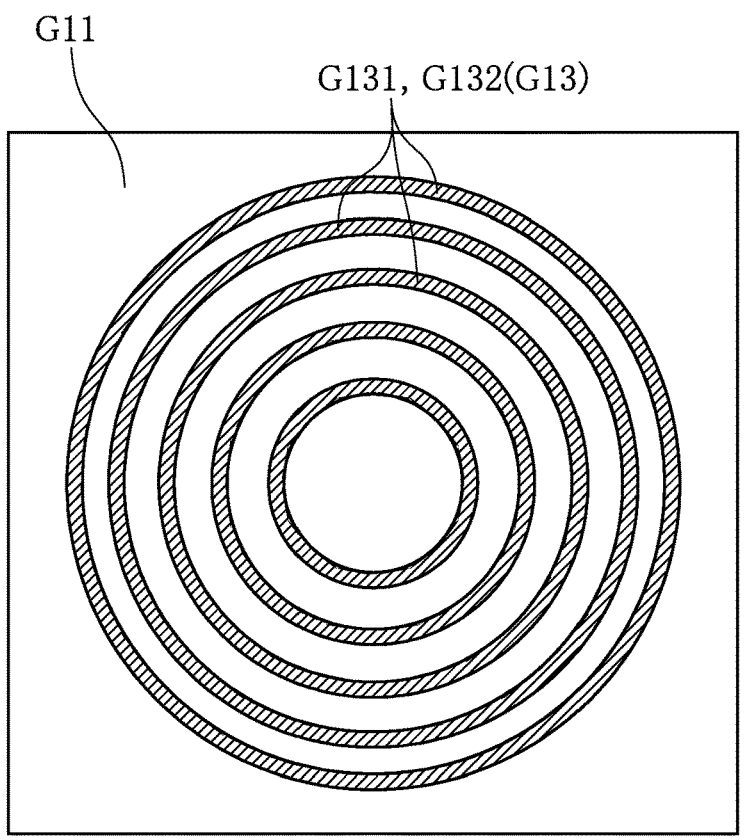
FIG. 31 shows an example of the shape of the second portion in plan view.
Figure 32:
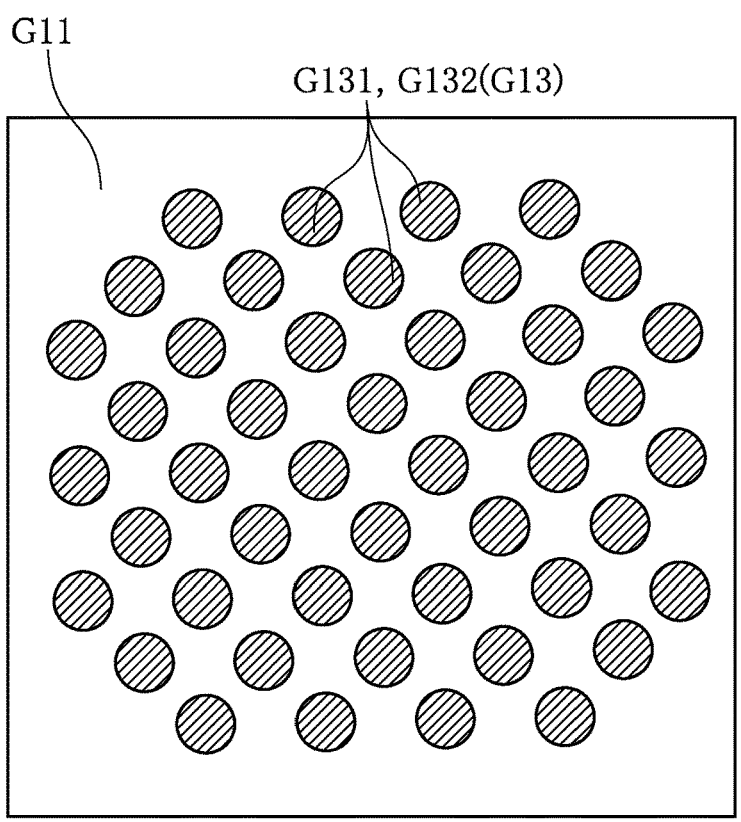
FIG. 32 shows an example of the shape of the second portion in plan view.
Figure 33:
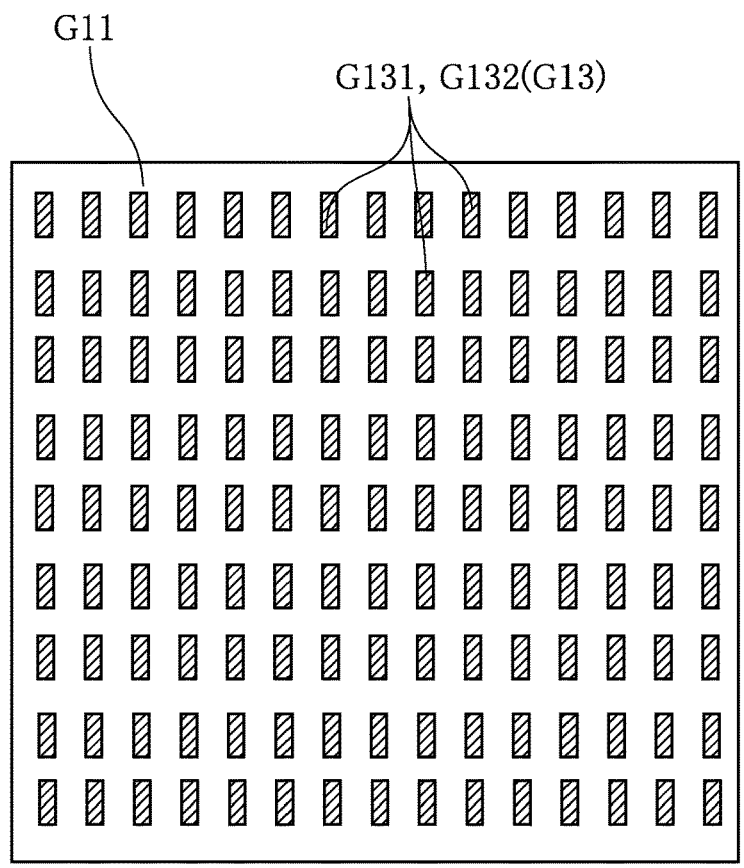
FIG. 33 shows an example of the shape of the second portion in plan view.

The second portion G13 shown in FIG. 30 includes a plurality of belt-like portions (i.e., a slit structure) as viewed in plan. The second portion G13 shown in FIG. 30 can exhibit a terahertz waveband polarization function and a frequency filter function, for example. The second portion G13 shown in FIG. 31 includes a plurality of annular portions (i.e., a ring structure) as viewed in plan. The second portion G13 shown in FIG. 31 can exhibit an antenna function and a light-collecting function, for example. The second portion G13 shown in FIG. 32 includes a plurality of dots (i.e., a dot structure) as viewed in plan. The second portion G13 shown in FIG. 32 can exhibit a beam-pattern control function and a two-dimensional resonator function, for example. Alternatively, the shape of the second portion G13 in plan view may be such as shown in FIG. 33 or in FIG. 34.

As shown in FIG. 29, the third portion G15 is disposed on the second portion G13. The third portion G15 is made of an insulating material, for example. Examples of such an insulating material include $SiO_2$, SiN, resin, and a polymer. As shown in FIG. 29, the third portion G15 may include a plurality of layers G151 and G152. The plurality of layers G151 and G152 are stacked on each other.

A separation distance LL between the member G10 and the semiconductor component B1, which is shown in FIG. 29, may be smaller than one wavelength of the terahertz wave (effective wavelength in the existing space) from the semiconductor component B1. When the separation distance LL is smaller than one wavelength of terahertz waves (an effective wavelength in the existing space) from the semiconductor component B1, the terahertz waves from the semiconductor component B1 can be suitably radiated outside by utilizing a near-field coupling. For example, if the semiconductor component B1 is exposed to the air, one wavelength is approximately 1 mm, and thus the separation distance LL may be smaller than 1 mm.

Figures 34, 35:
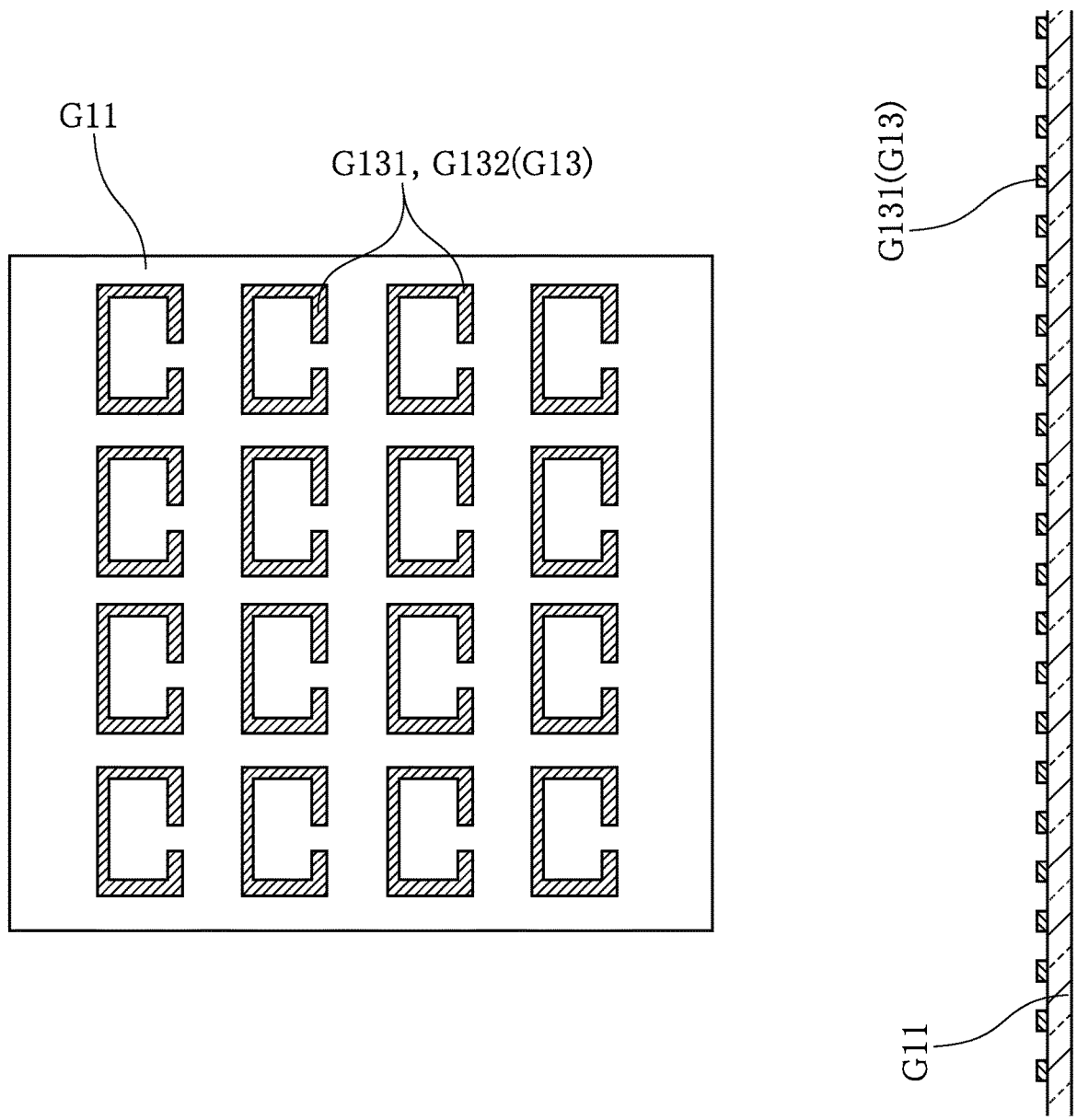
FIG. 34 shows an example of the shape of the second portion in plan view.
FIG. 35 is a sectional view showing the structure of a first portion at one point in manufacturing the first portion in FIG. 29.
Figure 36:
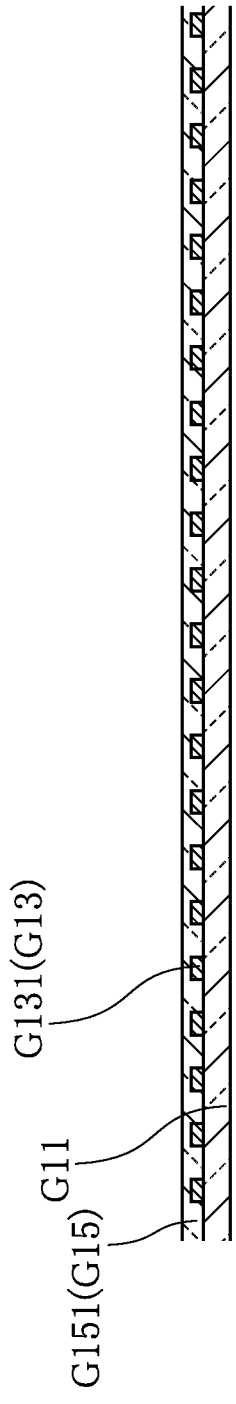
FIG. 36 is a sectional view showing the structure of the first portion at one point in manufacturing the first portion in FIG. 29.
Figure 37:
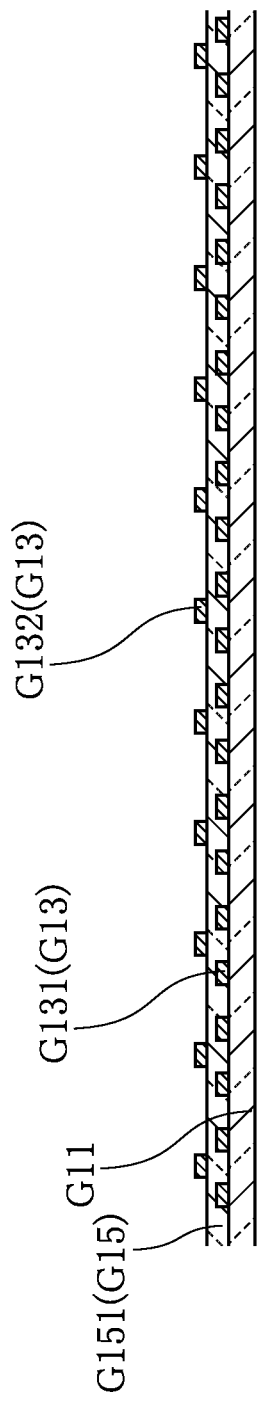
FIG. 37 is a sectional view showing the structure of the first portion at one point in manufacturing the first portion in FIG. 29.
Figure 38:
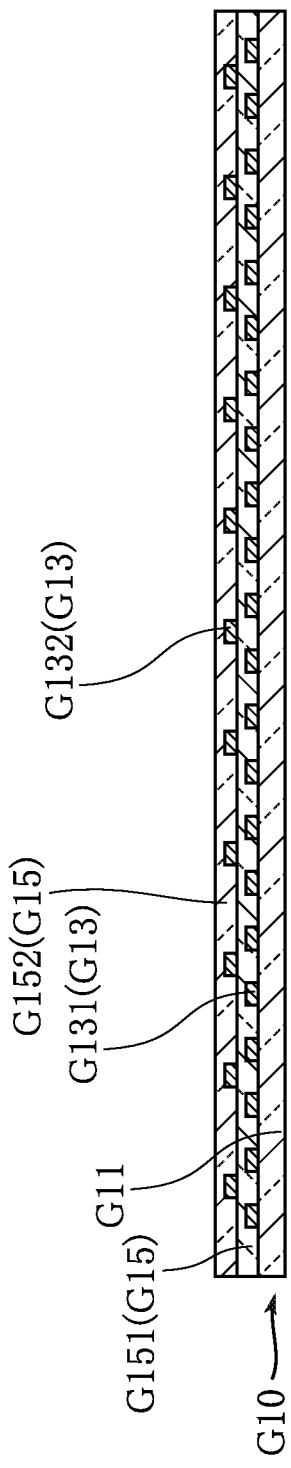
FIG. 38 is a sectional view showing the structure of the first portion at one point in manufacturing the first portion in FIG. 29.

A brief description of a method for manufacturing the member G10 will be described with reference to FIGS. 35 to 38. First, as shown in FIG. 35, the layer G131 of the second portion G13 is formed on the first portion G11. The layer G131 may be made of metal. The layer G131 may be formed by patterning, for example. Next, as shown in FIG. 36, the layer G151 of the third portion G15 is formed. The layer G151 may be formed by first forming an insulating material on the layer G131 and then polishing the surface of the insulating material. Note that the surface polishing is not absolutely necessary. Next, the layer G132 and the layer G152 are formed in sequence as shown in FIGS. 37 and 38, in the same manner as described with reference to FIGS. 35 and 36. Thereafter, dicing is performed to obtain the member G10 shown in FIG. 38.

Figure 41:
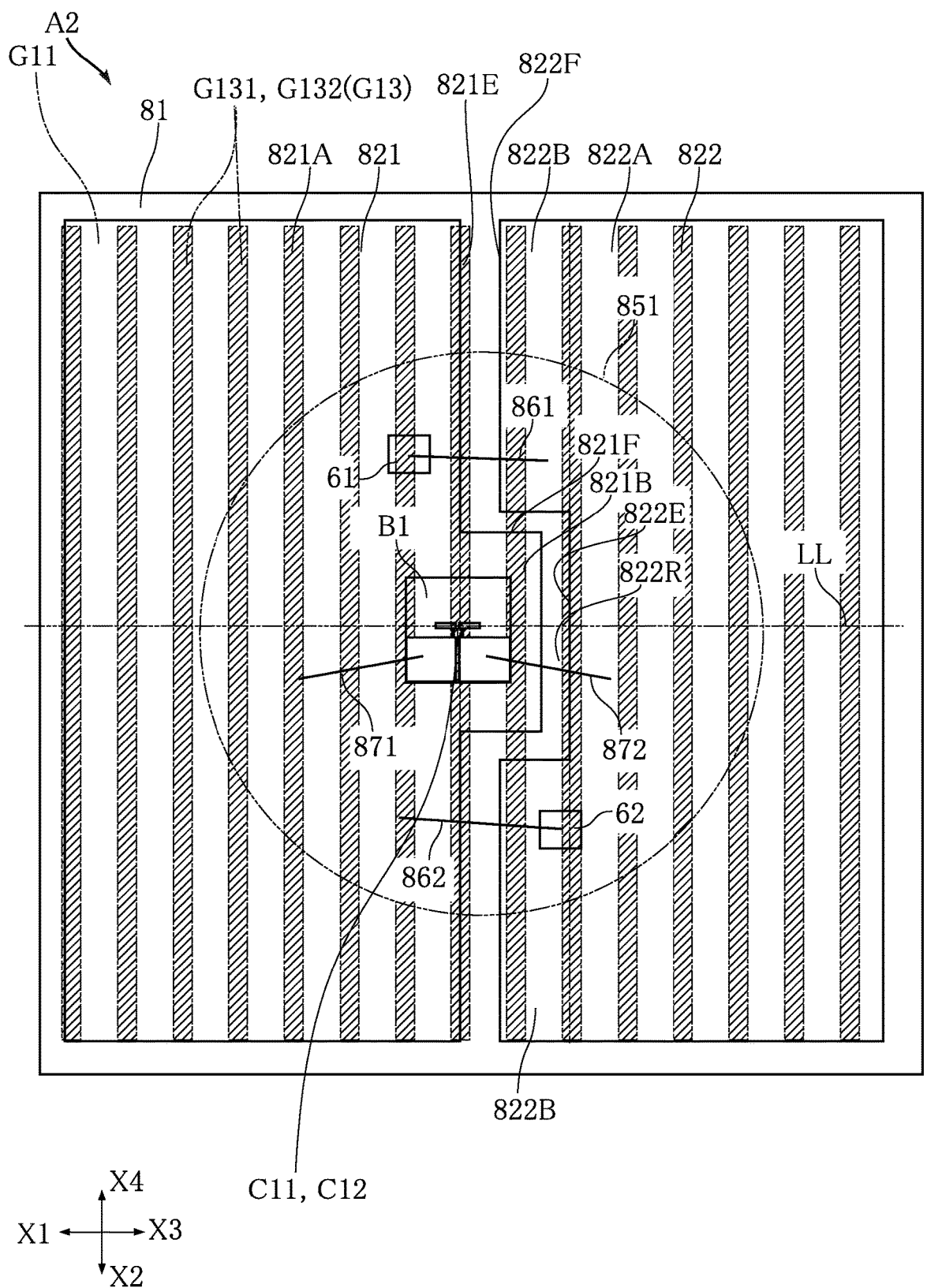
FIG. 41 is a plan view showing a terahertz device according to a variation of the first embodiment.
Figure 42:
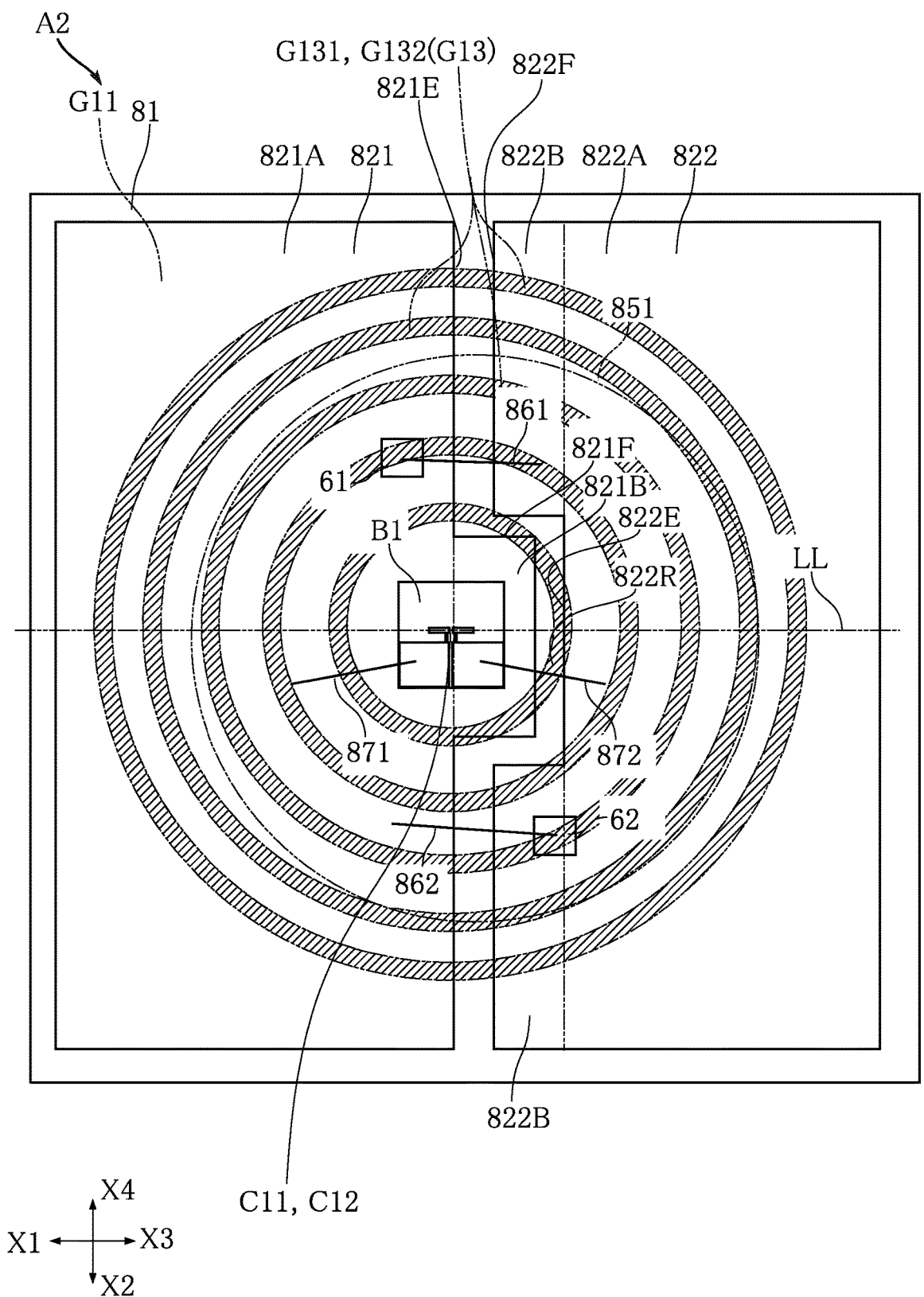
FIG. 42 is a plan view showing a terahertz device according to a variation of the first embodiment.
Figure 43:
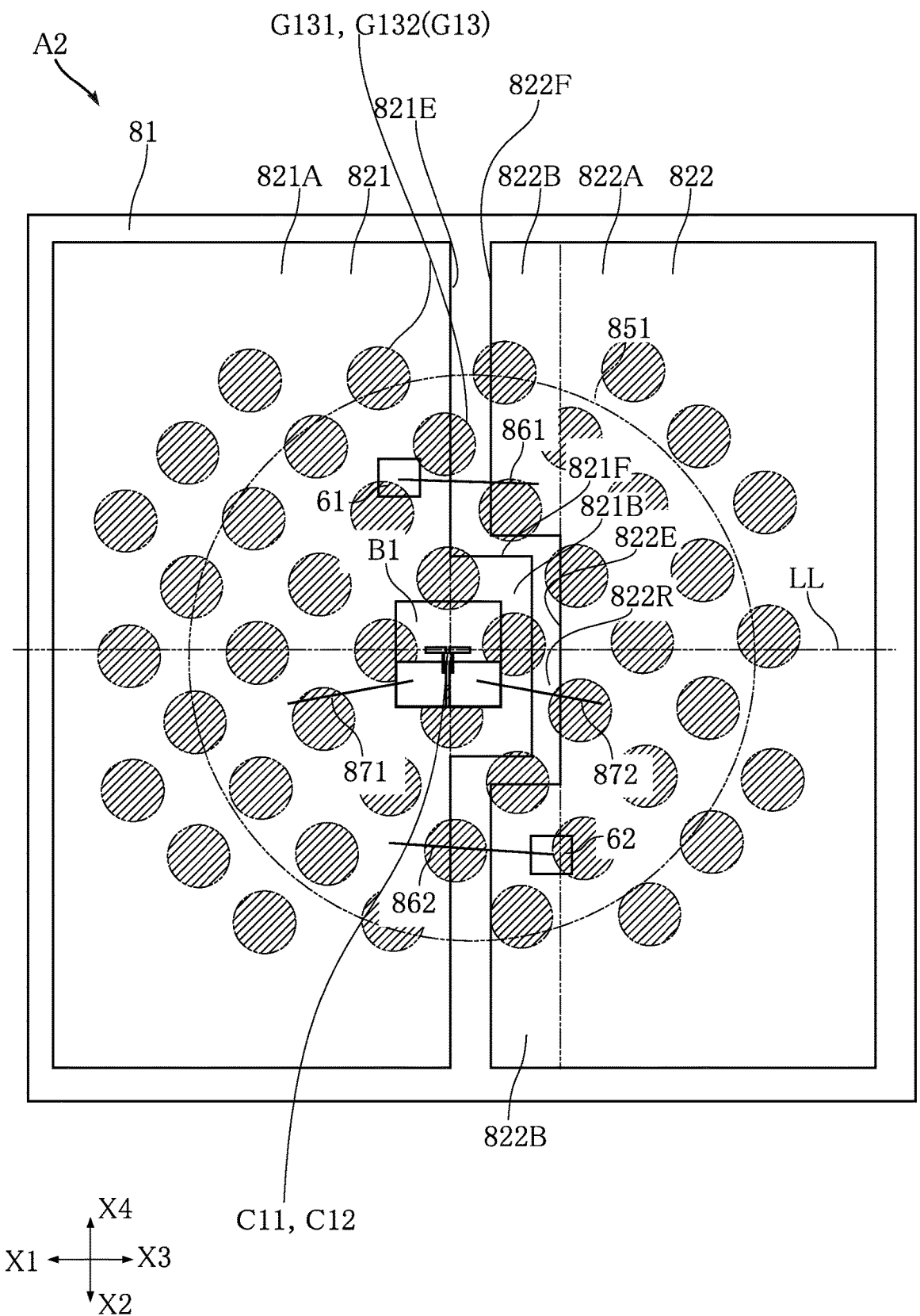
FIG. 43 is a plan view showing a terahertz device according to a variation of the first embodiment.
Figure 44:
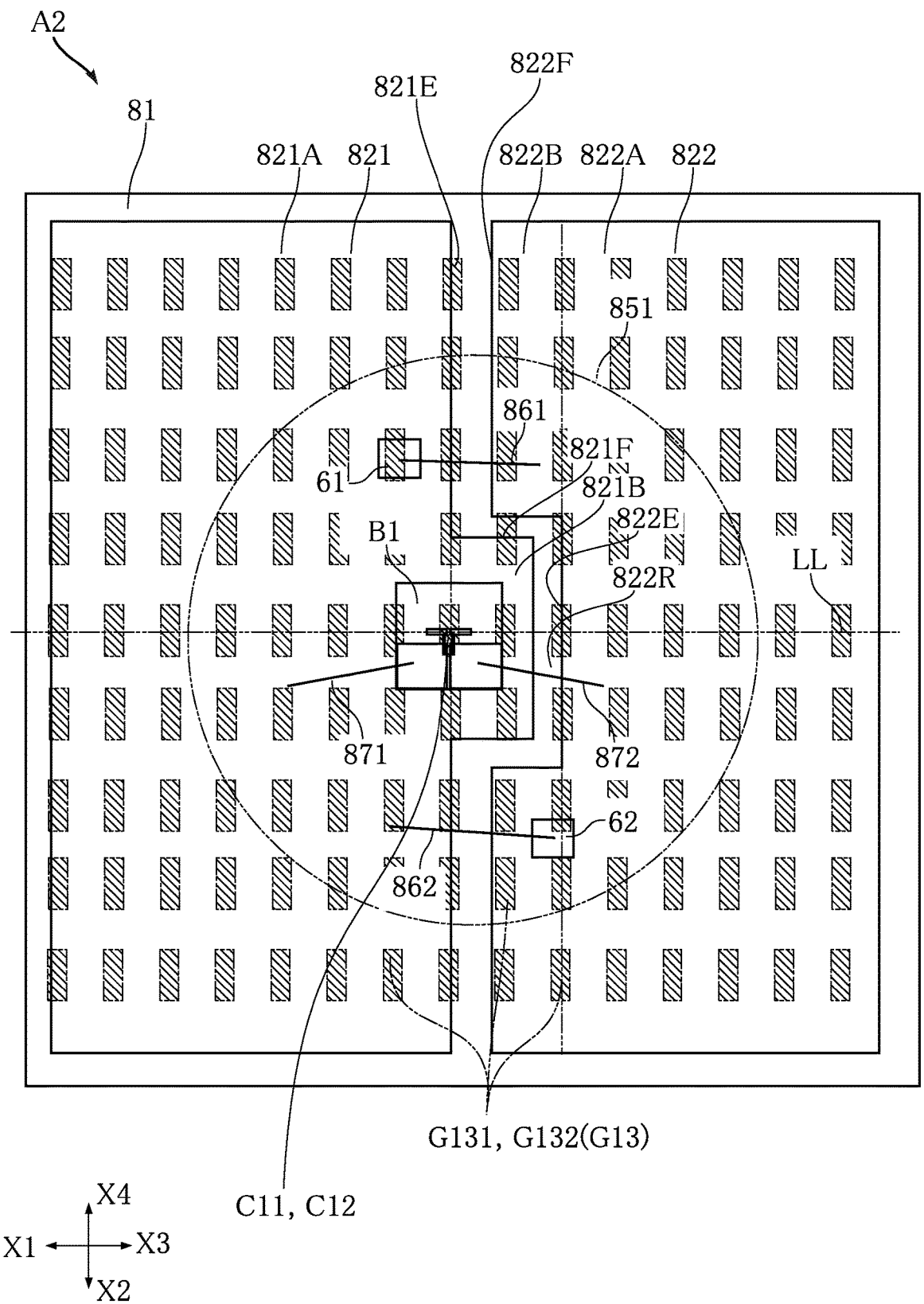
FIG. 44 is a plan view showing a terahertz device according to a variation of the first embodiment.
Figure 45:
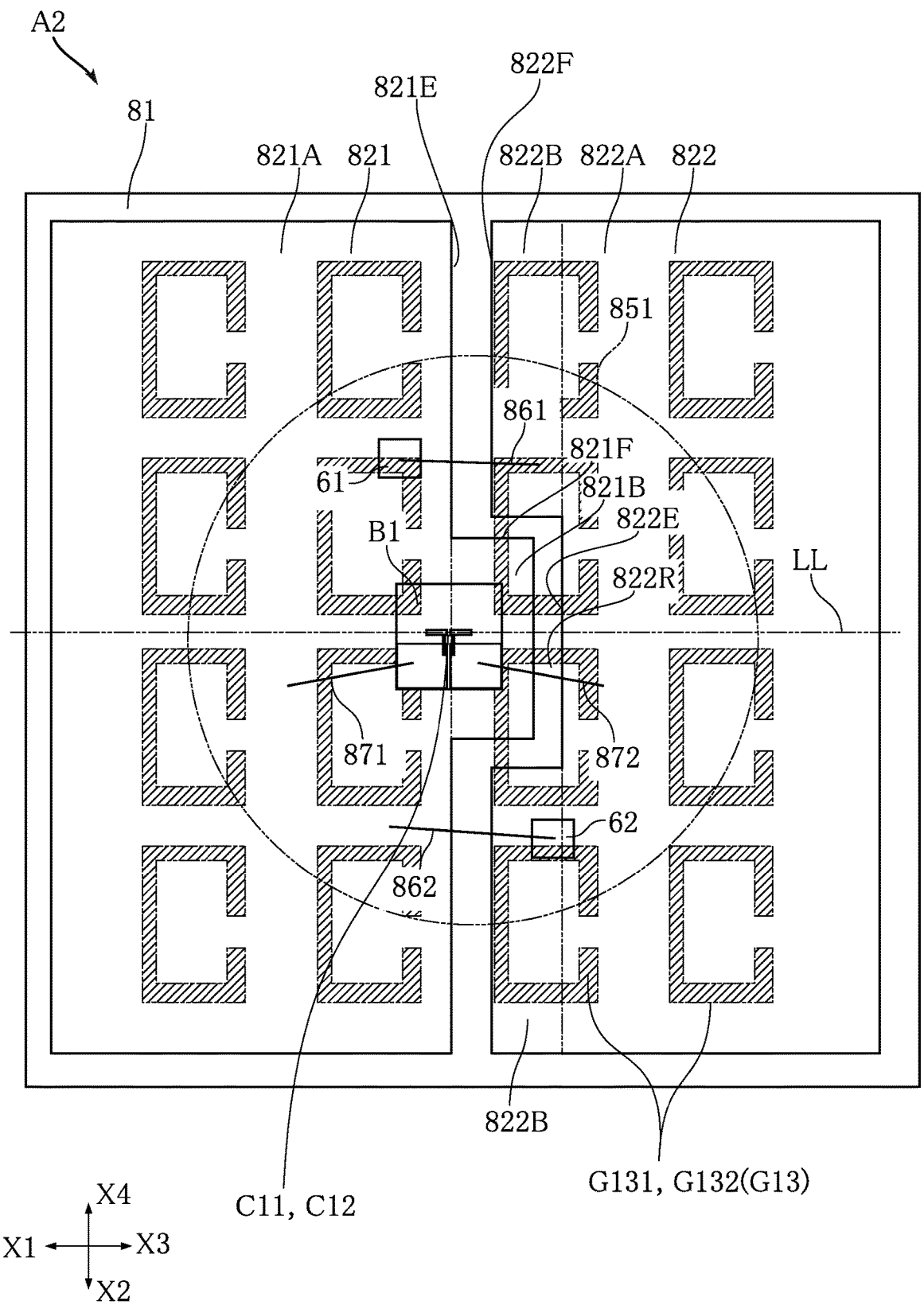
FIG. 45 is a plan view showing a terahertz device according to a variation of the first embodiment.

FIG. 41 shows a plan view of a device according to the present variation. The device shown in FIG. 41 has a combination of the structure shown in FIG. 26 and the structure shown in FIG. 30. In FIG. 41, a center point C11 of a semiconductor component B1 coincides with a symmetry point C12 of the second portion G13 (that is, the second portion G13 is point-symmetric about the symmetry point C12 in plan view).

Instead of the structure shown in FIG. 41, it is possible to employ a combination of the structure shown in FIG. 26 and any of the structures shown in FIGS. 31 to 34. FIGS. 42 to 45 each show a combination of the structure shown in FIG. 26 and one of the structures shown in FIGS. 31 to 34. In FIGS. 42 to 45, as with the example structure described above, the center point C11 of the semiconductor component B1 coincides with the symmetry point C12 of the second portion G13 (that is, the second portion G13 is point-symmetric about the symmetry point C12 in plan view).

In the variation shown in FIG. 29, the space 851 formed in the resin member 85 is filled with gas. Such an arrangement can suppress the attenuation of terahertz waves when the terahertz waves transmit the resin member, as compared to the case where the space 851 is filled with resin. Furthermore, the present variation can decrease or prevent the occurrence of a problem in which the adhesion of the resin to the semiconductor component B1 changes a boundary condition and affects the resonance mode within the chip substrate.

In the present variation, the second portion G13 is made of a conductive material. Such an arrangement allows the second portion G13 to exhibit a desired function to terahertz waves. Thus, a more preferable terahertz device can be provided. The second portion G13 may include a plurality of layers G131. In this case, the plurality of layers G131 can exhibit different functions, for example.

The present disclosure is not limited to the foregoing embodiment. The specific configuration of each part of the present disclosure may be varied in many ways.

The present disclosure includes an embodiment according to the following clauses.

Clause. 1

A terahertz device comprising:
a semiconductor substrate;
a terahertz element disposed on the semiconductor substrate; and
a first rectifying element electrically connected to the terahertz element in parallel.

Clause 2.

The terahertz device according to clause 1, further comprising a second rectifying element electrically connected to both of the terahertz element and the first rectifying element in parallel.

Clause 3.

The terahertz device according to clause 2, wherein
each of the first rectifying element and the second rectifying element includes a first terminal and a second terminal,
an electrical direction from the first terminal to the second terminal in each of the first rectifying element and the second rectifying element being a forward direction, and
the first terminal of the first rectifying element is electrically connected to the second terminal of the second rectifying element.

Clause 4.

The terahertz device according to clauses 2 or 3, wherein
the first rectifying element has a first rising voltage value and a first breakdown voltage value, the second rectifying element has a second rising voltage value and a second breakdown voltage value,
an absolute value of the first rising voltage value is smaller than an absolute value of the first breakdown voltage value,
an absolute value of the second rising voltage value is smaller than an absolute value of the second breakdown voltage value, and
each of the first rising voltage value and the second rising voltage value is larger than a lower limit of an absolute value of a value in a voltage region in which the terahertz element radiates terahertz waves.

Clause 5.

The terahertz device according to clause 4, wherein each of the first rising voltage value and the second rising voltage value is larger than an upper limit of an absolute value of a value in the voltage region in which the terahertz element radiates terahertz waves.

Clause 6.

The terahertz device according to any of clauses 2 to 5, further comprising
a first conductive layer and a second conductive layer formed on the semiconductor substrate and insulated from each other, wherein
the first rectifying element and the second rectifying element are formed on the semiconductor substrate and electrically interposed between the first conductive layer and the second conductive layer.

Clause 7.

The terahertz device according to clause 6, further comprising
a first semiconductor layer and a second semiconductor layer formed on the semiconductor substrate and stacked on each other, wherein
the first semiconductor layer has a first conductive type, and the second semiconductor layer has a second conductive type opposite to the first conductive type,
the first terminal of the first rectifying element and the second terminal of the second rectifying element are made of the first conductive layer, and
the second terminal of the first rectifying element and the first terminal of the second rectifying element are made of the second conductive layer.

Clause 8.

The terahertz device according to any of clauses 2 to 5, further comprising
a first conductive section and a second conductive section that are insulated from each other, wherein
the terahertz element is electrically interposed between the first conductive section and the second conductive section, and
the first conductive section extends along a first direction from where the terahertz element is positioned in plan view, and the second conductive section extends along a direction opposite to the first direction from where the terahertz element is positioned.

Clause 9.

The terahertz device according to clause 8, further comprising:
a support on which the semiconductor substrate is disposed; and
a first wire bonded to the terahertz element and the support, wherein
the first wire is formed while avoiding an imaginary straight line that extends along the first conductive section in plan view.

Clause 10.

The terahertz device according to clause 9, further comprising
a second wire bonded to the terahertz element and the support, wherein
the second wire is formed while avoiding the imaginary straight line in plan view.

Clause 11.

The terahertz device according to clause 9 or 10, wherein the first rectifying element and the second rectifying element are disposed on opposite sides with the imaginary straight line therebetween in plan view.

Clause 12.

The terahertz device according to any of clauses 8 to 11, wherein
the support includes a first conductive element and a second conductive element that are insulated from each other, and
the terahertz device and the first rectifying element are disposed on the first conductive element, and the second rectifying element is disposed on the second conductive element.

Clause 13.

The terahertz device according to clause 12, wherein
the first conductive element includes a first section and a second section extending from the first section toward the second conductive element, and
the terahertz device is disposed on the second section of the first conductive element.

Clause 14.

The terahertz device according to clause 13, wherein the first rectifying element is disposed on the second section of the first conductive element.

Clause 15.

The terahertz device according to clause 13 or 14, wherein the second conductive element includes a section facing the first section, and the second rectifying element is disposed on the section of the second conductive element.

Clause 16.

The terahertz device according to any of clauses 1 to 15, further comprising:

a resin member having a space that surrounds the terahertz element; and a member disposed on the resin member and exposed to the space, wherein the space is filled with gas.

Clause 17.

The terahertz device according to clause 16, wherein the member includes a first portion disposed on the resin member and a second portion disposed on the first portion, and the second portion is made of a conductive material.

Clause 18.

The terahertz device according to clause 17, wherein the second portion includes at least one from among at least one belt-like portion, at least one annular portion, and at least one dot.

The invention claimed is:

1. A terahertz device comprising:

a semiconductor substrate;

a terahertz element disposed on the semiconductor substrate;

a first rectifying element electrically connected to the terahertz element in parallel; and a second rectifying element electrically connected to both of the terahertz element and the first rectifying element in parallel, wherein the first rectifying element has a first rising voltage value and a first breakdown voltage value, the second rectifying element has a second rising voltage value and a second breakdown voltage value, an absolute value of the first rising voltage value is less than an absolute value of the first breakdown voltage value, an absolute value of the second rising voltage value is less than an absolute value of the second breakdown voltage value, and each of the first rising voltage value and the second rising voltage value is greater than a lower limit of an absolute value of a value in a voltage region in which the terahertz element radiates terahertz waves.

2. The terahertz device according to claim 1, wherein each of the first rectifying element and the second rectifying element comprises a first terminal and a second terminal, an electrical direction from the first terminal to the second terminal in each of the first rectifying element and the second rectifying element being a forward direction, and the first terminal of the first rectifying element is electrically connected to the second terminal of the second rectifying element.

3. The terahertz device according to claim 1, wherein each of the first rising voltage value and the second rising voltage value is greater than an upper limit of an absolute value of a value in the voltage region in which the terahertz element radiates terahertz waves.

4. A terahertz device comprising:

a semiconductor substrate;

a terahertz element disposed on the semiconductor substrate;

a first rectifying element electrically connected to the terahertz element in parallel;

a second rectifying element electrically connected to both of the terahertz element and the first rectifying element in parallel; and a first conductive layer and a second conductive layer formed on the semiconductor substrate and insulated from each other, wherein the first rectifying element and the second rectifying element are formed on the semiconductor substrate and electrically interposed between the first conductive layer and the second conductive layer.

5. The terahertz device according to claim 4, further comprising:

a first semiconductor layer and a second semiconductor layer formed on the semiconductor substrate and stacked on each other, wherein the first semiconductor layer has a first conductive type, and the second semiconductor layer has a second conductive type opposite to the first conductive type, the first terminal of the first rectifying element and the second terminal of the second rectifying element are made of the first conductive layer, and the second terminal of the first rectifying element and the first terminal of the second rectifying element are made of the second conductive layer.

6. A terahertz device comprising:

a semiconductor substrate;

a terahertz element disposed on the semiconductor substrate;

a first rectifying element electrically connected to the terahertz element in parallel;

a second rectifying element electrically connected to both of the terahertz element and the first rectifying element in parallel; and a first conductive section and a second conductive section that are insulated from each other, wherein the terahertz element is electrically interposed between the first conductive section and the second conductive section, and the first conductive section extends along a first direction from where the terahertz element is positioned in plan view, and the second conductive section extends along a direction opposite to the first direction from where the terahertz element is positioned.

7. The terahertz device according to claim 6, further comprising:

a support on which the semiconductor substrate is disposed; and a first wire bonded to the terahertz element and the support, wherein the first wire is formed while avoiding an imaginary straight line that extends along the first conductive section in plan view.

8. The terahertz device according to claim 7, further comprising:

a second wire bonded to the terahertz element and the support, wherein the second wire is formed while avoiding the imaginary straight line in plan view.

9. The terahertz device according to claim 7, wherein the first rectifying element and the second rectifying element are disposed on opposite sides with the imaginary straight line therebetween in plan view.

10. The terahertz device according to claim 6, wherein the support includes a first conductive element and a second conductive element that are insulated from each other, and the terahertz device and the first rectifying element are disposed on the first conductive element, and the second rectifying element is disposed on the second conductive element.

11. The terahertz device according to claim 10, wherein
the first conductive element includes a first section and a second section extending from the first section toward the second conductive element, and
the terahertz device is disposed on the second section of the first conductive element.

12. The terahertz device according to claim 11, wherein the first rectifying element is disposed on the second section of the first conductive element.

13. The terahertz device according to claim 11, wherein the second conductive element includes a section facing the first section, and the second rectifying element is disposed on the section of the second conductive element.

14. The terahertz device according to claim 1, further comprising:
a resin member having a space that surrounds the terahertz element; and
a member disposed on the resin member and exposed to the space, wherein the space is filled with gas.

15. The terahertz device according to claim 14, wherein the member includes a first portion disposed on the resin member and a second portion disposed on the first portion, and
the second portion is made of a conductive material.

16. The terahertz device according to claim 15, wherein the second portion includes at least one among at least one belt-like portion, at least one annular portion, and at least one dot.

17. The terahertz device according to claim 4, further comprising:
a resin member having a space that surrounds the terahertz element; and
a member disposed on the resin member and exposed to the space,
wherein the space is filled with gas.

18. The terahertz device according to claim 17, wherein the member includes a first portion disposed on the resin member and a second portion disposed on the first portion, and
the second portion is made of a conductive material.

19. The terahertz device according to claim 6, further comprising:
a resin member having a space that surrounds the terahertz element; and
a member disposed on the resin member and exposed to the space,
wherein the space is filled with gas.

20. The terahertz device according to claim 19, wherein the member includes a first portion disposed on the resin member and a second portion disposed on the first portion, and
the second portion is made of a conductive material.

* * * * *